US009690887B2

(12) United States Patent
Coudouent et al.

(10) Patent No.: US 9,690,887 B2
(45) Date of Patent: Jun. 27, 2017

(54) METHOD FOR THE STRUCTURAL ANALYSIS OF PANELS CONSISTING OF AN ISOTROPIC MATERIAL AND STIFFENED BY TRIANGULAR POCKETS

(75) Inventors: Gerard Coudouent, Fontenilles (FR); Paolo Messina, Toulouse (FR)

(73) Assignee: AIRBUS OPERATIONS (S.A.S), Toulouse (FR)

(*) Notice: Subject to any disclaimer, the term of this patent is extended or adjusted under 35 U.S.C. 154(b) by 1151 days.

(21) Appl. No.: 13/395,744

(22) PCT Filed: Sep. 13, 2010

(86) PCT No.: PCT/FR2010/051900
§ 371 (c)(1),
(2), (4) Date: May 25, 2012

(87) PCT Pub. No.: WO2011/030079
PCT Pub. Date: Mar. 17, 2011

(65) Prior Publication Data
US 2012/0245862 A1    Sep. 27, 2012

(30) Foreign Application Priority Data
Sep. 14, 2009   (FR) .................................... 09 56286

(51) Int. Cl.
*G06F 17/50* (2006.01)
(52) U.S. Cl.
CPC ................ *G06F 17/5018* (2013.01)
(58) Field of Classification Search
CPC .................................................. G06F 17/5018

USPC ................................................... 702/42; 4/42
See application file for complete search history.

(56) References Cited

U.S. PATENT DOCUMENTS

| 5,736,645 A * | 4/1998 | Chin-Chan | G01N 3/32 73/791 |
| 7,840,389 B2 * | 11/2010 | Gallet | G06F 17/5004 244/119 |
| 2004/0055349 A1 | 3/2004 | El-Soudani | |
| 2006/0089823 A1 * | 4/2006 | Meyer | G06F 17/5018 703/2 |
| 2008/0103740 A1 * | 5/2008 | Meizoso Latova | G06F 17/5018 703/7 |

OTHER PUBLICATIONS

International Search Report and Written Opinion of the International Searching Authority issued Jan. 30, 2013, in PCT/FR2010/051900, filed Sep. 13, 2010 (with English Translation of Category of Cited Documents).

(Continued)

*Primary Examiner* — Ricky Ngon
(74) *Attorney, Agent, or Firm* — Oblon, McClelland, Maier & Neustadt, L.L.P.

(57) ABSTRACT

The invention relates to a method for dimensioning, by an analytical method, of an essentially plane panel consisting of a homogenous and isotropic material, said panel consisting of a skin reinforced by a set of three parallel bundles of stiffeners built into the panel. The pockets determined on the skin by said groups of stiffeners are triangular, the stiffeners are blade shaped and the stiffened panel must comply with specifications for mechanical resistance to predetermined external loads, the angles between bundles of stiffeners being such that the triangular pockets have any kind of isosceles form.

12 Claims, 16 Drawing Sheets

(56) References Cited

OTHER PUBLICATIONS

Craig Collier, et al., "Composite, Grid-Stiffened Panel Design for Post Buckling Using Hypersizer®", American Institute of Aeronautics and Astronautics, vol. AIAA-2002-1222, XP 002580376, Apr. 25, 2002, pp. 1-16.
V. V. Vasiliev, et al., "Anisogrid composite lattice structures for spacecraft and aircraft applications", Composite Structures, vol. 76, No. 1-2, XP 025150611, Oct. 2006, pp. 182-189.
W. Akl, et al., "Optimization of the static and dynamic characteristics of plates with isogrid stiffeners", Finite Elements in Analysis and Design, vol. 44, No. 8, XP 022622025, May 2008, pp. 513-523.

* cited by examiner

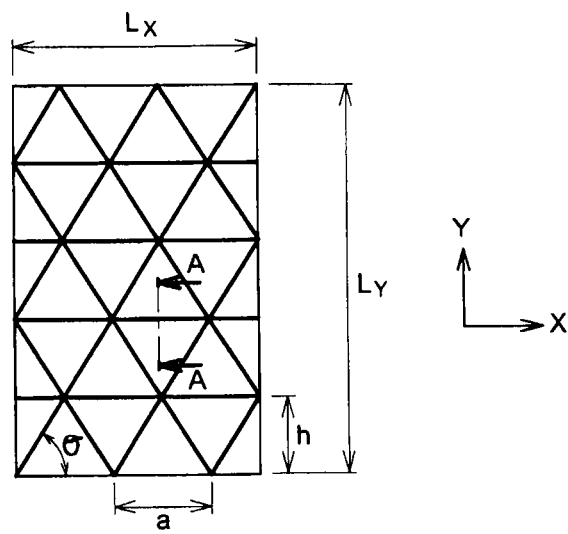
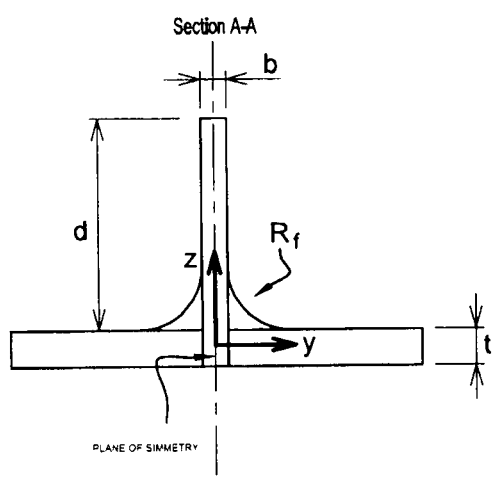
Fig. 3
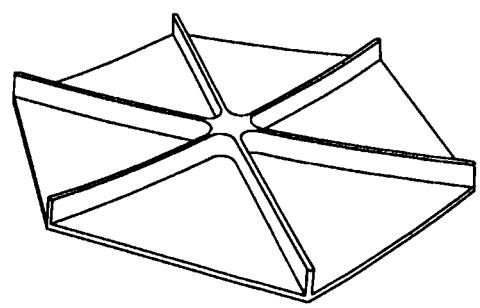
Fig. 4

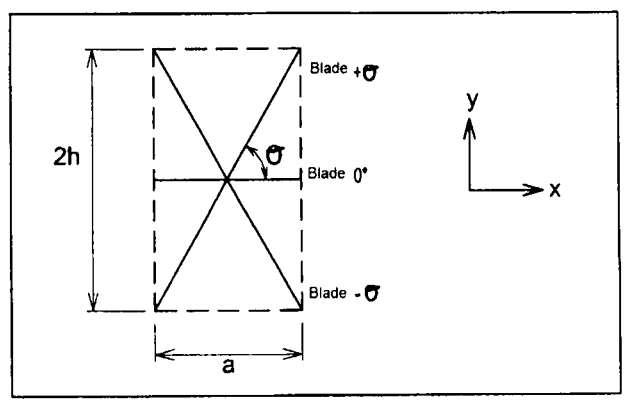
Fig. 11
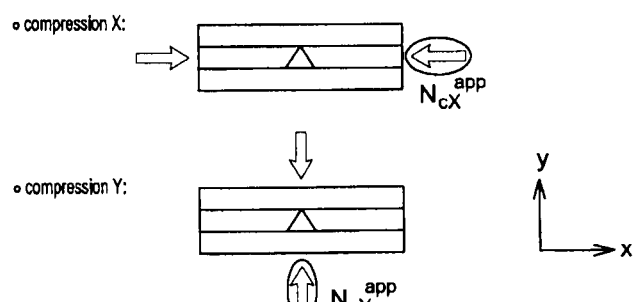
Fig. 12
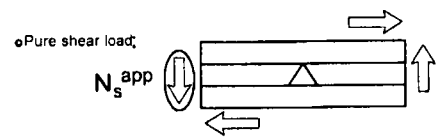
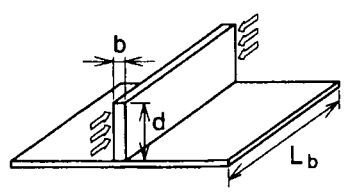
Fig. 13

| | Boundary conditions | Formula $k_c$ | Lim | $k_c^\infty$ |
|---|---|---|---|---|
| 1 | Conservative boundary conditions<br>free<br>ss — ss<br>ss | $k_c = \left(\dfrac{d}{L_b}\right)^2 + 0.43$ | ∞ | 0.43 |
| 2 | "Rigid" peripheral blades<br>Free<br>Clamped — Clamped<br>ss | $k_c = 4.143 \cdot \left(\dfrac{d}{L_b}\right)^2 + 0.384$ | 9.49 | 0.43 |
| 3 | "Rigid" panel and peripheral blades<br>Free<br>Clamped — Clamped<br>Clamped | $k_c = 0.007 \cdot \left(\dfrac{L_h}{d}\right)^2 + 3.923 \cdot \left(\dfrac{d}{L_h}\right)^2 + 0.94$ | 4.34 | 1.28 |
| 4 | "Rigid panel"<br>Free<br>ss — ss<br>Clamped | $k_c = 0.136 \cdot \left(\dfrac{L_h}{d}\right)^2 + 0.987 \cdot \left(\dfrac{d}{L_b}\right)^2 + 0.551$ | 1.64 | 1.28 |

If $\dfrac{L_b}{d}$ >Lim Then $K_c = K_c^\infty$

Fig. 14

| $k_s$ | β | | | | | | | | | | | | | | | |
|---|---|---|---|---|---|---|---|---|---|---|---|---|---|---|---|---|
| | | 0.0 | 0.2 | 0.4 | 0.6 | 0.8 | 1.0 | 1.2 | 1.4 | 1.6 | 1.8 | 2.0 | 2.2 | 2.4 | 2.6 | 2.8 | 3.0 |
| $\bar{\alpha}$ | 0.0 | 3.3 | 3.8 | 4.2 | 4.6 | 5.0 | 5.4 | 5.7 | 6.1 | 6.4 | 6.7 | 7.0 | 7.3 | 7.6 | 7.9 | 8.2 | 8.5 |
| | 0.1 | 3.3 | 3.8 | 4.2 | 4.6 | 5.0 | 5.4 | 5.8 | 6.1 | 6.4 | 6.8 | 7.1 | 7.4 | 7.7 | 8.0 | 8.3 | 8.6 |
| | 0.2 | 3.4 | 3.9 | 4.3 | 4.7 | 5.2 | 5.6 | 5.9 | 6.3 | 6.6 | 7.0 | 7.3 | 7.6 | 8.0 | 8.3 | 8.6 | 8.9 |
| | 0.3 | 3.5 | 4.0 | 4.4 | 4.9 | 5.4 | 5.8 | 6.2 | 6.6 | 6.9 | 7.3 | 7.7 | 8.0 | 8.4 | 8.8 | 9.1 | 9.4 |
| | 0.4 | 3.6 | 4.1 | 4.6 | 5.1 | 5.6 | 6.0 | 6.5 | 7.0 | 7.4 | 7.8 | 8.2 | 8.6 | 9.0 | 9.4 | 9.8 | 10.1 |
| | 0.5 | 3.7 | 4.3 | 4.9 | 5.5 | 6.0 | 6.5 | 7.0 | 7.4 | 7.8 | 8.3 | 8.8 | 9.2 | 9.6 | 10.0 | 10.5 | 10.9 |
| | 0.6 | 4.2 | 4.7 | 5.3 | 5.8 | 6.3 | 6.8 | 7.3 | 7.8 | 8.4 | 8.9 | 9.4 | 9.9 | 10.4 | 11.0 | 11.5 | 12.0 |
| | 0.7 | 4.2 | 4.8 | 5.4 | 6.0 | 6.6 | 7.2 | 7.8 | 8.4 | 9.0 | 9.7 | 10.3 | 10.8 | 11.4 | 12.0 | 12.6 | 13.2 |
| | 0.8 | 4.2 | 4.9 | 5.7 | 6.4 | 7.1 | 7.8 | 8.5 | 9.2 | 9.9 | 10.6 | 11.2 | 11.9 | 12.6 | 13.3 | 14.0 | 14.6 |
| | 0.9 | 4.4 | 5.2 | 6.1 | 6.8 | 7.7 | 8.5 | 9.2 | 10.0 | 10.8 | 11.6 | 12.4 | 13.2 | 13.9 | 14.7 | 15.5 | 16.2 |
| | 1.0 | 4.8 | 5.8 | 6.6 | 7.6 | 8.4 | 9.3 | 10.2 | 11.0 | 12.0 | 12.8 | 13.6 | 14.5 | 15.4 | 16.2 | 17.1 | 17.9 |

Fig. 24

METHOD FOR THE STRUCTURAL ANALYSIS OF PANELS CONSISTING OF AN ISOTROPIC MATERIAL AND STIFFENED BY TRIANGULAR POCKETS

The present invention is from the domain of structures. It particularly concerns structures of a stiffened panel type, and even more particularly such panels which are reinforced by stiffeners. The invention is concerned with calculating the resistance of such structures subjected to combined loads.

PRIOR ART AND THE PROBLEM POSED

Thin, stiffened structures represent the greater part of primary commercial aircraft structures.

Panels are generally reinforced with stiffeners which are perpendicular to each other and which define rectangular zones on the skin of the panel, limited by stiffeners and referred to as pockets.

The structure of an aeroplane is thus conceived with a skeleton of stiffeners and a skin:
- longitudinal stiffeners (generally referred to as longerons): they provide support for the structure in the principal direction of loads
- transversal stiffeners (generally called "frame" or "rib"): their main function is to provide support for the longerons
- a panel (generally called skin): as a general rule, it takes up loading in the plane (membrane)

The longerons and the stringers are set at 90° to each other and define rectangular pockets on the skin.

However, during the 1950's and 60's, for spacecraft structures, NASA developed a new concept for stiffened structures called "Isogrid" (see FIG. 1).

Such a stiffened structure thus composed of a reinforced skin with a network of stiffeners set at $\Theta°$ ($\Theta=60°$, in the structures envisaged by NASA) between them. The stiffeners are blade shaped and are built into the panel. Because of its geometry, this configuration possesses orthotropic qualities (isotropic when $\Theta=60°$) and the pockets formed on the skin are triangular.

In the following description, the terms structure stiffened by triangular pockets or panel stiffened by triangular pockets are used to define the structures or panels reinforced by crossed stiffeners forming triangular pockets.

Limited data is available in literature for calculating the resistance and the stability of such a structure stiffened by triangular pockets.

State of the Art of Calculation Methods for Panels Stiffened by Triangular Pockets A method for the analytical calculation of panels stiffened by equilateral triangular pockets is described in the NASA Contract Report "Isogrid" design handbook" (NASA-CR-124075, 02/1973)

This method is well documented, but presents some serious limitations: use of equilateral triangles only: angle=60°, calculation of applied stresses but no calculation of stress capacity, Poisson coefficient of the material equal to only ⅓.

The prior method presents many limitations and does not take into account all the problems which are presented on an aircraft structure, in particular concerning boundary conditions and plasticity. It cannot therefore be used reliably for the analytical calculation of the structure of panels stiffened by triangular pockets.

OBJECTIVES OF THE INVENTION

In order to carry out a structural analysis of panels stiffened by triangular pockets, a method for structural analysis was developed, based on a theory of composite plate and taking into account its specific modes of failure. This method is applied to flat panels made of a material with isotropic properties.

The method described herein envisages a modification of the base angle between the stiffeners (which is 60° in the "Isogrid" structures). This signifies that the isotropic quality of the panel is no longer guaranteed.

EXPLANATION OF THE INVENTION

The invention relates, to this effect, to a method of dimensioning by an analytical method, an essentially flat panel consisting of a homogenous and isotropic material, the panel being composed of a skin reinforced by a set (known as "grid") of three parallel bundles of stiffeners built into the panel, the pockets determined on the skin by said groups of stiffeners are triangular, the stiffeners are blade shaped and the stiffened panel must comply with specifications for mechanical resistance to predetermined external loads, the angles between bundles of stiffeners being such that the triangular pockets have any kind of isosceles shape.

According to one advantageous implementation, the method includes the steps:

Step 2—of calculating the stresses applied in the skin and the stiffeners, as well as the flow in the skin and loads in the stiffeners, based on the geometry of the stiffened panel, and the external loads, assumed to be in the plane of the panel and applied at the centre of gravity of the section (of the panel), the stiffened panel being represented by an assembly of two orthotropic plates, the grid of stiffeners being represented by an equivalent panel.

Step 3—of calculating the internal loads of the stiffened panel,

Step 4—of resistance analysis including a calculation of reserve factors of the material at capacity and ultimate load, Step 5—of calculating the local stress capacity, In preference, the method takes into account the redistribution of applied stresses between the panel and the grid of stiffeners due:

to the post-buckling of stiffeners, by the definition of an effective straight section for each type of stiffener (0°, +θ or −θ). $A_{0°}^{st}$, $A_{+\theta}^{st}$ and $A_{-\theta}^{st}$, to the post-buckling of the pocket through the calculation of an effective thickness of the panel: $t_{s\_eff}$, to the plasticity of applied external loads, through an iterative process on the various properties of the material, in particular Young's modulus and Poisson coefficients: $E_{0°}^{st}$, $E_{+\theta}^{st}$, $E_{-\theta}^{st}$ for the stiffeners and $E_x^s$, $E_y^s$ and $v_{ep}^{st}$ for the skin, using the Ramberg-Osgood law.

According to a preferred mode of implementation of the method according to the invention, this includes a step of correcting the applied loads to take into account plasticity, using an iterative method for calculating the plastic stresses, carried out until the five parameters of the material ($E_{0°}^{st}$, $E_{+\theta}^{st}$, $E_{-\theta}^{st}$, $E_{skin}$, $v_{ep}$) entered at the start of the process are noticeably equal to the same parameters obtained after the calculation of plastic stress.

According to an advantageous implementation, the method includes a step 4, of analysing resistance comprising a calculation of the reserve factors of the material at a capacity and ultimate load, carried out by comparing the applied loads calculated in the stiffened panel components with the maximum stress capacity of the material, the applied loads being corrected to take into account the plasticity of the stiffened panel.

According to an advantageous implementation, the method includes a step 5 for calculating the local stress capacity, which includes a sub-step 5A of calculating the buckling flow capacity, and the reserve factor for the isosceles triangular pockets, the applied stresses to be taken into account for the calculation of the reserve factor being only the stresses affecting the skin, the external flows used being the flows of the skin do not correspond to the stiffened panel being fully loaded.

In this case, step 5A of calculating the buckling flow capacity and reserve factor for the isosceles triangular pockets favourably includes two sub-steps: firstly of calculating the capacity values for plates subjected to cases of pure loading (compression according to two directions in the plane, shear load) by using a finite element method, then calculating the interaction curves between these cases of pure loading.

Even more precisely, calculating the capacity values includes the following sub-steps of:
Creating an FEM parametric model of a triangular plate
Testing various combinations to obtain buckling results,
Obtaining parameters that are compatible with an analytical polynomial formula In a particular mode of implementation, in the case of pure loading, the interaction curves are defined by the following sub-steps:
of creating finite element models of several triangular plates with different isosceles angles, the isosceles angle ($\theta$) being defined as the base angle of the isosceles triangle,
for each isosceles angle:
1/ of calculating by Finite Element Model to determine the flow capacity of wrinkling (without plastic correction) for various plate thicknesses.
2/ of tracing a flow curve of buckling capacity according to the $$\frac{D}{h^2}$$

ratio (D plate stiffness, h height of the triangle), this curve being determined for the small values of $$\frac{D}{h^2},$$

by a second degree equation according to this ratio, of which the coefficients $K_1$ and $K_2$ depend on the angle and the load case being considered,
3/ of tracing the evolution of coefficients of the polynomial equation $K_1$ and $K_2$ according to the base angle of the isosceles triangle, these coefficients being traced according to the angle of the triangular plates being considered, and interpolation to determine a polynomial equation which makes it possible to calculate the constants whatever the isosceles angle.

Again, in the case of calculation of the buckling flow capacity and reserve factor of isosceles triangular pockets, according to an advantageous implementation, in the case of combined loading, the following hypothesis is used: if some components of the combined load are under pressure, these components are not taken into account for the calculation, and the interaction curves are defined by the following sub-steps:
of creating finite element models of several triangular plates with different isosceles angles, the isosceles angle ($\theta$) being defined as the base angle of the isosceles triangle,
for each angle,
1/ of calculating by Finite Element Model (FEM) to determine the eigenvalue of buckling that corresponds to the various distributions of external loads.
2/ of tracing the interaction curves, for each angle and each combination of loads and approximating these curves with a unique equation covering all these combinations:

$$R_{cX}^A + R_{cY}^B + R_s^C = 1 \text{ (or } R_i = \frac{N_i^{app}}{N_i^{crit}},$$

equations in which $R_i$ represents the load rate and $N_i^{app}$ and $N_i^{crit}$ the applied flows and critical flows for i=cX, cY or s, corresponding to cases of compression according to axes X and Y, and to a case of shear load), A, B, C being empirical coefficients.

Advantageously, the method also comprises a sub-step of calculating reserve factors, by solving the following equation:

$$\left(\frac{R_{cY}}{R}\right)^A + \left(\frac{R_{cX}}{R}\right)^B + \left(\frac{R_s}{R}\right)^C = 1$$

$$\text{with } R = \frac{N_{cY}^{app}}{N_{cYcomb}^{crit}} = \frac{N_{cX}^{app}}{N_{cXcomb}^{crit}} = \frac{N_s^{app}}{N_{scomb}^{crit}} = \frac{1}{RF}$$

According to an advantageous implementation, the method uses, for the calculation of plasticity corrected stress capacity, a plasticity correction factor $\eta$, defined by:
for all cases of loading (pure and combined) with the exception of shear load, $$\eta_5 = \frac{E_{tan}}{E_c}$$

for cases of pure shear loading:

$$\eta_6 = \frac{(1+v_e)}{(1+v)} \cdot \frac{E_{sec}}{E_c}$$

the plasticity correction being calculated by using the equivalent elastic stress of Von Mises.

According to an advantageous implementation, in the case of simply supported or clamped isosceles triangular plates, in a case of combined loading, an interaction curve is used:

$$R_{cX} + R_{cY} + R_s^{\frac{3}{2}} = 1,$$

for all cases of loading.

According to an advantageous implementation, the method includes a step 5 for calculating the local stress capacity, which includes a sub-step 5B of calculating the buckling stress capacity, and reserve factor for the stiffener web, considered as a rectangular panel, the stresses applied for calculations of reserve factor being only the stresses in the stiffener webs.

According to an advantageous implementation of the method, this includes a step 6, of calculating general instability, providing data on buckling flow capacity, and reserve factors, for a flat stiffened panel, under pure or combined loading conditions, the flows applied, to be taken into account for the calculation of reserve factor being the external flows of the stiffened panel.

In this case, more specifically, the method advantageously includes the following sub-steps:
- of using a general behaviour law (equation 6-8), defining the flows and moments relations between flow and moments, on one hand, and strains, on the other, a state of plane stresses being considered,
- using general balance equations (equations 6-9 and 6-10) of an element of the stiffened panel, linking the flows, moments and the density of surface strengths,
- of solving a general differential equation (equation 6-17) between the stress flows, the surface strength density, strains and bending stiffeners.

According to a favourable implementation, the method includes an iteration step, making it possible to modify the values of applied stresses, or the dimensional values of panels, according to the results of at least one of steps 3 to 6.

In another respect, the invention relates to a computer programme product including a series of instructions adapted to implement a method such as explained, where this set of instructions is executed on a computer.

BRIEF DESCRIPTION OF FIGURES

The description which follows, given purely as an example of an embodiment of the invention, is given in reference to the annexed figures which represent:

FIG. 3—A geometric definition of a panel

FIG. 4—A junction in a structure stiffened by triangular pockets,

DETAILED DESCRIPTION OF A MODE OF EMBODIMENT OF THE INVENTION

The method for resistance analysis of a metal panel stiffened by triangular pockets, principally plane, described is intended to be implemented in the form of a programme on a computer of a known type.

The method is intended to be used for a structure which is principally plane (stiffeners and skin). The method here-described applies exclusively to the calculation of typical structural settings with the following boundaries:
- The edges of the studied zone do not border an opening.
- None of the stiffeners extend outside of the zone studied.
- Each cross section must be bordered by stiffeners.
- All the triangular pockets in the skin are assumed to have the same thickness.
- All the stiffeners are assumed to have the same dimensions.

This method is used for calculating panels built from a homogenous and isotropic material (for example—but not limited to—metal) for which the describing monotonically increasing curves ($\sigma$, $\epsilon$) can be idealised by the means of formulas such as R&O (see further on).

Figure 7:
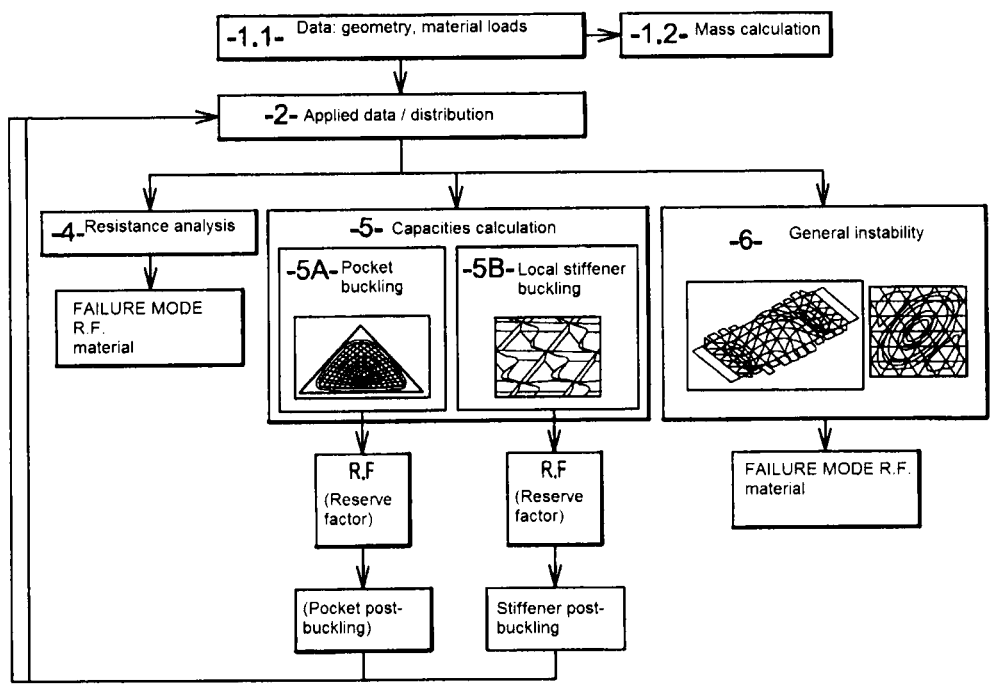

The simplified organogram of the method according to the invention is illustrated by FIG. 7.

Two types of failure (the occurrence of which is evaluated in steps 4 and 6 of the method) can occur on a structure stiffened by triangular pockets: A fault in material (which is the object of step 4): the applied stresses have reached the maximum stress capacity of the material ($F_{tu}$ or $F_{su}$), global failure: generalised buckling (including the grid of stiffeners) occurs on the whole panel (this verification is the object of step 6).

In addition, two types of instability (object of step 5) weaken the global rigidity of the structure stiffened by triangular pockets but do not cause the global failure of the complete structure:
- Instability of the panel: buckling of the triangular pockets
- Instability of the stiffeners: buckling of stiffener webs The buckled sections can only support a part of the load which they could support before they were buckled. Because of this, the applied loads are redistributed in the structure.

It is noted that in the present invention, post-buckling calculations are not processed. Because of this, the two types of buckling referred to above are considered as modes of failure.

Notation and Units

Figure 1:
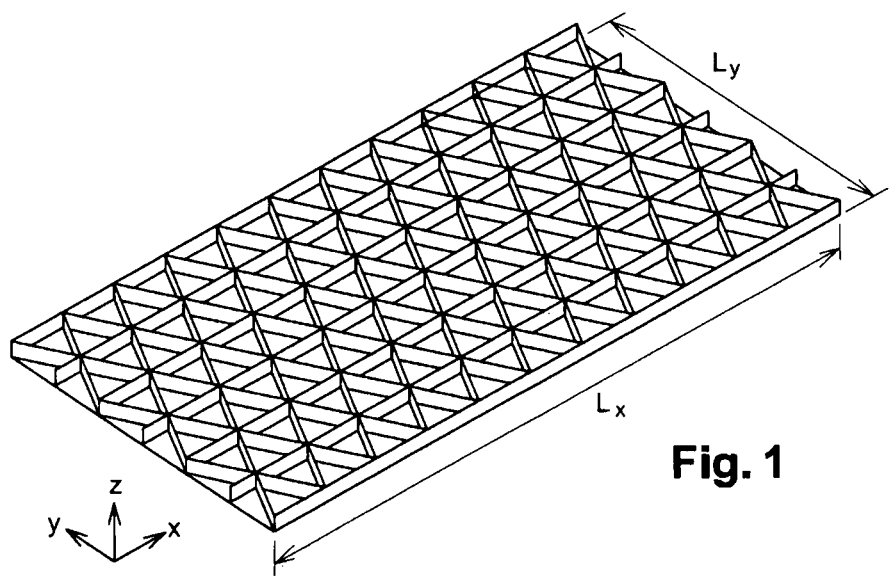
FIG. 1—An example of a flat panel stiffened by triangular pockets.
Figure 2:
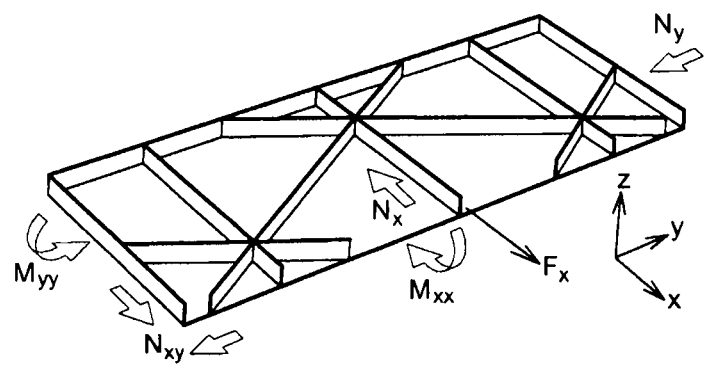
FIG. 2—A definition of loading and of the system of coordinates.

The conventions of notations and axis systems are explained in FIG. 2

A local system of coordinates is defined for each stiffener. An X axis is defined in the plane of the straight section of the stiffener, this is the exit axis, in the direction of the principal dimension of the stiffener. A Z axis is defined as the normal axis in the plane of the skin, in the direction of the stiffener. Finally, a Y axis is the third axis in a system of straight coordinates.

For forces and loads, a negative sign on a force according to the X axis signifies a compression of the stiffener, a positive sign signifies a tension.

A positive bending moment causes a compression in the skin and a tension in the stiffeners.

The general notations used are defined in the following table.

| Symbol | Unit | Description |
|---|---|---|
| A | $mm^2$ | Surface |
| I | $mm^4$ | Inertia |
| J | $mm^4$ | Torsion constant |
| K | N/mm | Normal rigidity (tension/compression) of a plate |
| D | N.mm | Bending rigidity of a plate |
| σ | $N/mm^2$ | Stress |
| ε | — | Strain |
| κ | — | Strain outside of the plane |
| η | — | Plastic correction factor |
| z | mm | Coordinates on the z axis |
| k | — | Buckling coefficient |

Suffixes:

| Symbol | Unit | Description |
|---|---|---|
| g | — | grid |
| st | — | stiffener |
| s | — | skin |

Geometric Characteristics

The geometric characteristics of a panel, considered here as a non-limitative example, are given in FIG. 3.

For the rest of the description, several hypotheses are used. It is supposed that the Z axis is a plane of symmetry for the straight section of the stiffener. Also, the dimensions a and h are defined according to the neutral fibre of a stiffener. In addition, the envisaged panel stiffened by triangular pockets does not have stiffeners on the two sides defined by: X=0 and X=Lx

| Symbol | Unit | Description |
|---|---|---|
| $L_X$ | mm | length |
| $L_Y$ | mm | width |
| a | mm | Length of the side of a triangle |
| θ | ° | Angle of the triangle |
| h | mm | Height of a triangle $\left(= \frac{a}{2} \cdot \tan \theta\right)$ |

-continued

| Symbol | Unit | Description |
|---|---|---|
| t | mm | Thickness of the skin |
| d | mm | Height of the stiffener web |
| b | mm | Thickness of the stiffener web |
| $R_n$ | mm | Fillet node radius |
| $R_f$ | mm | Pocket radius |
| $A_{x°}^{st}$ | $mm^2$ | Straight section of the stiffener according to axis x |
| $v_p$ | mm | Panel offset between its centre of gravity and the origin point of the local coordinates system |
| $v_w$ | mm | Stiffener network offset between its centre of gravity and the origin point of the local coordinates system |

Materials

| Symbol | Unit | Description |
|---|---|---|
| $F_{cy}$ | MPa | Elastical capacity of the material under compression |
| $F_{tu}$ | MPa | Ultimate tension resistance of the material |
| $F_{su}$ | MPa | Ultimate shear resistance of the material |
| $\sigma_n$ | MPa | Stress reference |
| $\epsilon_{ult}$ | — | Ultimate plastic strain (=e %) |
| $\nu_e$ | — | Elastic Poisson coefficient |
| $\nu_p$ | — | Plastic Poisson coefficient (=0.5) |
| $\nu$ | — | Elasto-plastic Poisson coefficient |
| $E_c$ | MPa | Young's elastic modulus in compression |
| E | MPa | Young's elastic modulus under tension |
| $E_{sec}$ | MPa | Secant modulus |
| $E_{tan}$ | MPa | Tangent modulus |
| $n_{ec}$ | — | Ramberg and Osgood (R&O) coefficient in compression |
| G | MPa | Shear modulus |
| $G_{sec}$ | MPa | Secant shear modulus |
| ρ | $kg/mm^3$ | Material density |

Stresses

| Symbol | Unit | Description |
|---|---|---|
| $P_i$ | N | Normal load with i equal to: 0° for the load applied on a stiffener at 0° x° for the load applied on a stiffener at x° |
| N | N/mm | Flow |
| M | N.mm | Bending moment |
| τ | MPa | Shear stress |
| σ | MPa | Normal stress |
| $\sigma_{crit}^i$ | MPa | Buckling stress of a panel i in compression |
| $\tau_{crit}^i$ | MPa | Buckling stress of a panel i in shear load |
| $\sigma_{app}^i$ | MPa | Applied stresses on the element i |
| RF | — | Reserve factor |
| $R_c$ | — | Compression load rate |
| $R_s$ | — | Shear load rate |
| $R_p$ | — | Load rate due to pressure |
| LL | | Load limit |
| UL | | Ultimate load |

DEFINITIONS

For the rest of the description the following terms are defined.

In a structure stiffened by triangular pockets, grid refers to the complete network of single stiffeners.

The term node is used to describe an intersection of several stiffeners in a structure stiffened by triangular pockets (see FIG. 4). In practice, it is an element of the complex design including bending radii in both directions.

Figure 5A:
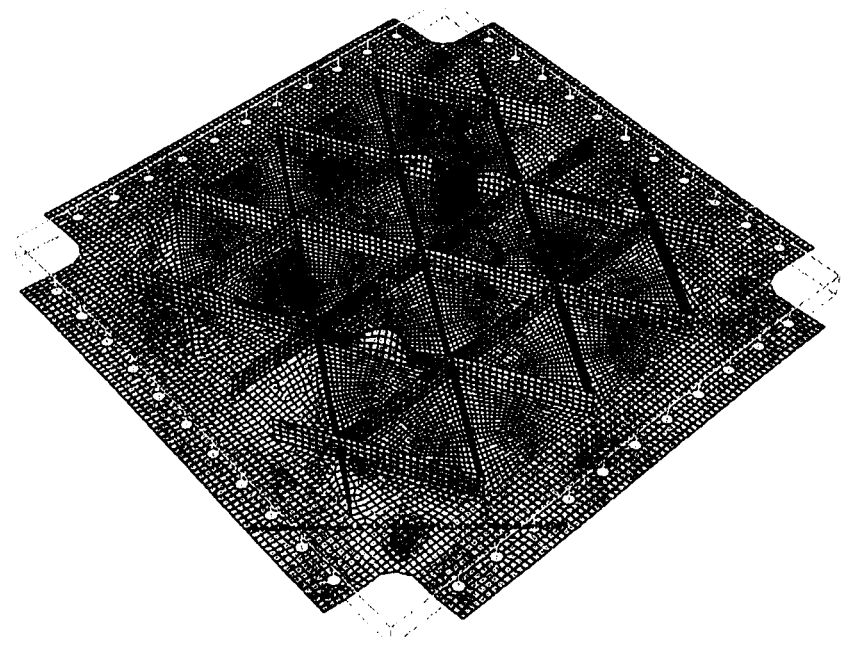
FIG. 5—An example of general instability of a panel stiffened by triangular pockets, FIG. 6—The theory of effective width, FIG. 7—A general organogram of the method according to the invention, FIG. 8—A decomposition of the grid in elementary triangles, FIG. 9—An elementary isosceles triangle used in the calculation of the panel mass, FIG. 10—An elementary rectangular triangle used in the calculation of the panel mass, FIG. 11—An elementary shape of a stiffener grid in a panel stiffened by triangular pockets, FIG. 12—A case of pure loadings of the stiffened plate, FIG. 13—A diagram of loads on a stiffener, FIG. 14—An expression of the Kc coefficients according to cases of boundary conditions, FIG. 15—A panel of stiffeners considered as an assembly of two orthotropic plates, FIG. 16—The loads on an elementary shape of a stiffener grid for a panel stiffened by triangular pockets, FIG. 17—A method for calculating plasticity corrected applied loads, FIG. 18—The notation conventions of the elementary isosceles triangle, FIG. 19—A linear or quadratic interpolation of the K coefficient, FIG. 20—A case of combined loading, FIG. 21—Conventions of flow and moments, FIG. 22—The value of $h(\overline{\alpha})$ according to the various boundary conditions, for a case of compression, FIG. 23—The shear buckling coefficient for a four-sided simply supported configuration, FIG. 24—A table of shear buckling coefficient values, FIG. 25—The shear buckling coefficient for a clamped four-sided configuration, FIG. 26—The evolution of the K1 constant according to the isosceles angle for a simply supported triangular plate, FIG. 27—The evolution of the K2 constant according to the isosceles angle for a simply supported triangular plate, FIG. 28—The evolution of the K1 constant according to the isosceles angle for a clamped triangular plate, FIG. 29—The evolution of the K2 constant according to the isosceles angle for a clamped triangular plate.

When a structure (subject to loads only in its plane) suffers significant, visible transversal displacements of loads in the plane, it is said to buckle. FIG. 5a illustrates such a case of local instability of a panel stiffened by triangular pockets.

The buckling phenomenon can be demonstrated by pressing the opposite sides of a flat cardboard sheet towards each other. For small loads, the buckle is elastic (reversible) because the buckle disappears when the load is removed.

Local buckling (or local instability) of plates or shells is indicated by the appearance of lumps, undulations or waves and is common in plates which compose thin structures. When considering stiffened panels, local buckling, as opposed to general buckling, describes an instability in which the panel between the longerons (stiffeners) buckles, but the stiffeners continue to support the panels and do not show any significant strains outside of the plane.

The structure can therefore present two states of balance:
Stable: in this case, displacements increase in a controlled manner when the loads increase, that is to say that the capacity of the structure to support additional loads is maintained, or
Unstable: in this case, strains instantly increase and the capacity to support loads rapidly declines A neutral balance is also possible in theory during buckling, this state is characterised by an increase in strain without modifying the load If buckling strains become too great, the structure fails. If a component or a part of a component is likely to suffer buckling, then its conception must comply with the stresses of both resistance and buckling.

General instability refers to the phenomenon which appears when the stiffeners are no longer able to counteract the displacements of the panel outside of the plane during buckling.

Figure 5B:
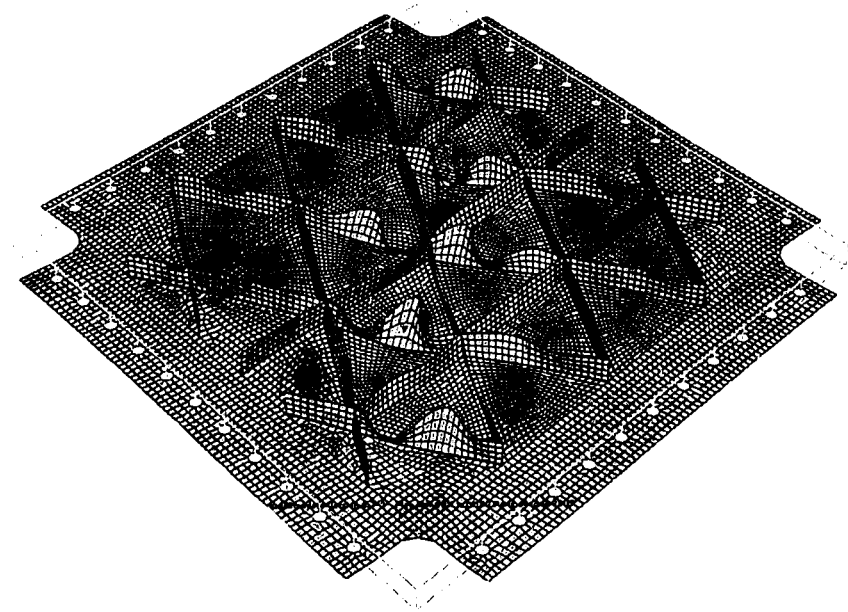

FIG. 5b shows an example of global buckling in compression of a structure stiffened by triangular pockets, when the panel reaches its first mode of general buckling.

Because of this, it is necessary to find out if the stiffeners act as simple supports of the panel (in compression, shear load and combination load). If this condition is not fulfilled, it must be supposed that the panel assembly and the stiffeners buckle in a global manner in a mode of instability, something which must be avoided in a structure designed for aeronautical use.

A general failure (or global) happens when the structure is no longer capable of supporting additional loads. It can be said therefore that the structure has reached failure loading or loading capacity.

General failure covers all types of failure:
Failure due to an instability (general instability, post-buckling . . . )
Failure caused by exceeding the maximum load supported by the material (for example after local buckling)

Effective width (or working width) of the skin of a panel is defined as the portion of the skin which is supported by a longeron in a stiffened panel structure which does not buckle when it is subject to an axial compression load.

Buckling of the skin alone does not constitute a panel failure; the panel will in fact support additional loads up to the stress at which the column formed by the stiffener and the effective panel starts to fail. When the stress in the stiffener goes above the buckling stress of the skin, the skin adjacent to the stiffener tolerates an additional stress because of the support provided by the stiffeners. However, the stress at the centre of the panel will not go above the initial buckling stress, whatever the stress reached at the level of the stiffener.

Figure 6:
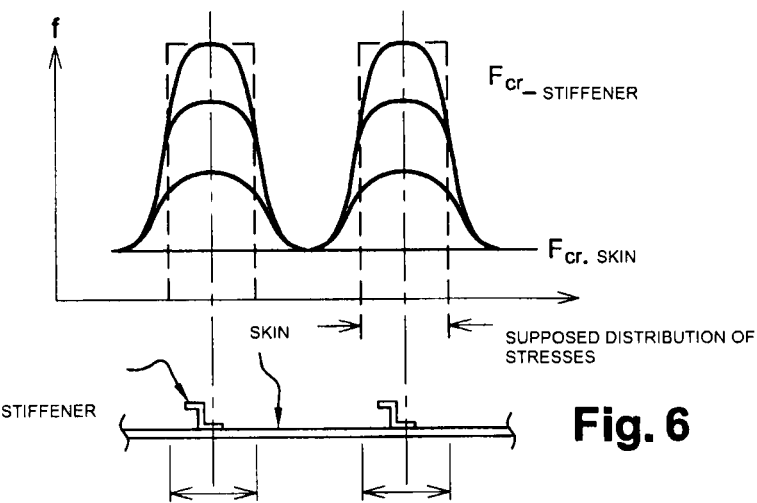

The skin is more effective around the position of the stiffeners because there is a local support against buckling. At a given level of stress, lower than that of local buckling of the skin, the effective width is equal to the width of the panel. The theory of effective width is illustrated by FIG. 6

Idealisation of Material

It is herewith noted that up to the yield stress ($F_{cy}$), the stress-strain curve of material is idealised by the known law of Ramberg and Osgood (referred to as the R&O formula in the rest of the description):

$$\varepsilon = \frac{\sigma}{E_c} + 0.002 \cdot \left(\frac{\sigma}{F_{cy}}\right)^{n_c} \qquad \text{Equation 0-1}$$

We can deduce the following expressions:
Secant modulus:

$$E_{sec} = \frac{\sigma}{\varepsilon} \xrightarrow{R\&O\ law} E_{sec} = \frac{1}{\frac{1}{E_c} + \frac{0.002}{F_{cy}} \cdot \left(\frac{\sigma}{F_{cy}}\right)^{(n_c-1)}} \qquad \text{Equation 0-2}$$

Tangent modulus $$\frac{1}{E_{tan}} = \frac{\partial(\varepsilon)}{\partial(\sigma)} = \frac{n_c}{E_{sec}} + \frac{1-n_c}{E_c} \xrightarrow{R\&O\ law} E_{tan} = \frac{1}{\frac{1}{E_c} + \frac{0.002}{F_{cy}} \cdot n_c \cdot \left(\frac{\sigma}{F_{cy}}\right)^{(n_c-1)}} \qquad \text{Equation 0-3}$$

Poisson coefficient:

$$v = \frac{E_{sec}}{E_c} \cdot v_e + \left(1 - \frac{E_{sec}}{E_c}\right) \cdot v_p \text{ With } v_p = 0.5 \qquad \text{Equation 0-4}$$

It is noted that, with the R&O ratio (parameter n or n corrected), known by those skilled in the art, these equations are only correct in the zone [0; $F_{cy}$]. For the following part of this study, this zone must be extended from $F_{cy}$ to $F_{tu}$. Over $F_{cy}$, different curves can be used up to the ultimate stress, in particular: R&O formula using a modified n coefficient, or elliptical method.

In the following, the R&O formula uses a modified coefficient. Continuity between the two curves is maintained. The modified n coefficient of the R&O formula is calculated by:

$$n = \frac{\ln\left(\frac{\varepsilon_{2p}}{\varepsilon_{1p}}\right)}{\ln\left(\frac{\sigma_2}{\sigma_1}\right)} \qquad \text{Equation 0-5}$$

With:
$\varepsilon_{2p} = \varepsilon_{ult}$
$\varepsilon_{1p} = 0.002$
$\sigma_2 = F_{tu}$
$\sigma_1 = F_{cy}$ It is noted that to use this formula, the following criterion must be respected: $F_{tu} > F_{cy}$ and $\varepsilon_{ult} > 0.002$ In the elliptical method, above $F_{cy}$, another curve is used up to the ultimate stress: the elliptical extension curve. Naturally, the continuity between the R&O curve and the elliptical extension curve is ensured.

The stress-strain ratios of the elliptical extension are:

$$\varepsilon_E(\sigma) = \varepsilon_3 - a\sqrt{1 - \frac{(\sigma - \sigma_{E\_ref} + b)^2}{b^2}}; \quad \text{Equation 0-6}$$

$$\sigma_E(\varepsilon) = \sigma_{E\_ref} - b + b\sqrt{1 - \frac{(\varepsilon - \varepsilon_3)^2}{a^2}}$$

with:

$$a = \sqrt{\frac{-b^2 \cdot x_1}{m \cdot (b - D)}}; \quad b = \frac{D \cdot (m \cdot x_1 + D)}{m \cdot x_1 + 2D} - \text{ellipse parameters}$$

$$x_1 = \varepsilon_2 - \varepsilon_3; \quad D = \sigma_{E\_ref} - \sigma_{RO\_ref}; \quad m = \frac{E}{1 + \varepsilon_{RO\_ref} \cdot \frac{nE}{\sigma_{RO\_ref}}}$$

Plasticity

Again it is noted that, it is known that plasticity correction factors depend on the type of load and boundary conditions.

The plasticity correction factors for flat rectangular panels are presented in table 1 below.

| Loading | Boundary conditions | Equation |
|---|---|---|
| Compression and bending | Flange with a hinged edge unloaded (free-supported edges) | $\eta_1 = \frac{E_{sec}}{E_c} \cdot \frac{1 - v_e^2}{1 - v^2}$ |
| | Flange with a fixed unloaded edge (clamped - free edges) | $\eta_2 = \eta_1 \cdot \left(0.33 + 0.335 \cdot \sqrt{1 + 3 \cdot \frac{E_{tan}}{E_{sec}}}\right)$ |
| | Plate with unloaded hinged edges (supported edges) | $\eta_3 = \eta_1 \cdot \left(0.5 + 0.25\sqrt{1 + 3\frac{E_{tan}}{E_{sec}}}\right)$ |
| | Plate with unloaded fixed edges (clamped edges) | $\eta_4 = \eta_1 \cdot \left(0.352 + 0.324\sqrt{1 + 3\frac{E_{tan}}{E_{sec}}}\right)$ |
| Compression | Column | $\eta_5 = \frac{E_{tan}}{E_c}$ |
| Shear load | all conditions $\sigma_{eq} = \tau \cdot \sqrt{3}$ | $\eta_6 = \frac{G_{sec}}{G}$ |
| Shear load | re-tightened edges $\sigma_{eq} = \tau \cdot 2$ | $\eta_8 = \eta_1\left(0.83 + 0.17\frac{E_{tan}}{E_{sec}}\right)$ |

In the specific case of shear load, the compression stress-strain curve of the material is equally used as follows:

Calculation of the equivalent normal stress: $\sigma_{eq} = \tau \cdot \sqrt{3}$ Calculation of the corresponding $E_s$ and $v$ values based on this stress: $\sigma_{eq}$ $$\eta_6 = \frac{G_s}{G} = \left(\frac{1 + v_e}{1 + v}\right) \cdot \frac{E_{sec}}{E_c} = \left(\frac{1 - v}{1 - v_e}\right) \cdot \eta_1$$

Step 1—Data Entry Module: Geometry, Material, Loading

The method includes a first phase of entering data relating to the panel stiffened by triangular pockets being considered and to the loading applied to this panel. These data are entered using known means and memorised in a data base which is also of a known type.

The entry parameters for the analytical calculation of panels stiffened by triangular pockets particularly include:

General dimensions: rectangular panel (dimensions: $L_x$, $L_y$)
Straight section of stiffeners: dimensions of the web: b, d
Constant thickness of the panel (t)
Load boundaries of the panel $N_x$, $N_y$, $N_{xy}$
Calculation of Mass This part is designed for the complete calculation of the mass of the panel stiffened by triangular pockets, including taking into account the radii of the fillet and the node. This step of calculating mass is independent from the rest of the method described herein. The mass is calculated in a known manner using the geometrical definition of the panel.

Data entered for this process are the geometry of the panel including the radii of pockets and nodes ($R_n$ and $R_f$). Exit data is the panel's mass.

Figure 8:
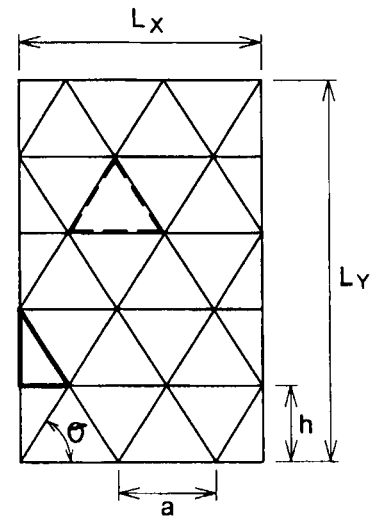
Figure 9:
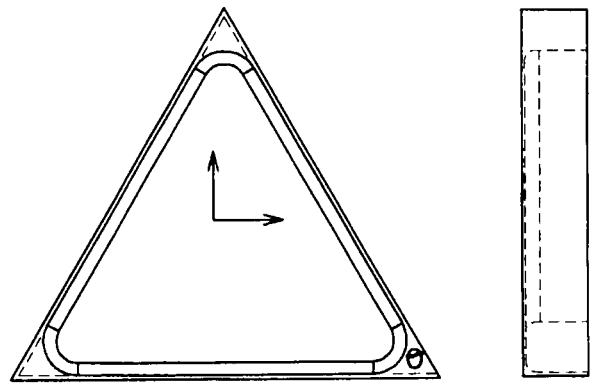
Figure 10:
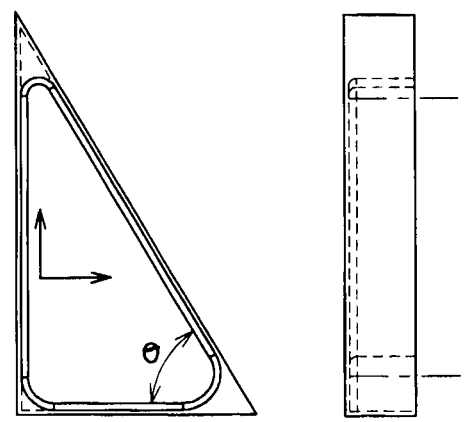

Mass is calculated by adding up the mass of the skin and the longerons. The radii of filets between two longerons and between the skin and the longerons are also taken into account. Calculation of mass is based on two elementary triangles: an isosceles triangle and a rectangular triangle (see FIGS. 8, 9 and 10).

Step 2—Calculation of Applied Loads

This step makes it possible to calculate the stresses applied in the skin and the stiffeners based on the geometry of the panel stiffened by triangular pockets and the external loads. The method takes into account a plasticity correction of applied loads, done using an iterative process. It makes it possible to take into account the post-buckling of stiffeners and pockets.

This represents substantial progress in relation to the NASA "Isogrid" design handbook" (NASA-CR-124075, 02/1973) in that it particularly takes into account the following points: grid of stiffeners with $\theta \neq 60$, panel stiffened by triangular pockets considered as an assembly of two orthotropic plates.

The entry data for this step are:
Geometric data:
  $\theta$: angle of the base of the triangle,
  a: base of the triangle,
  $A_i^{st}$: straight section of the stiffener, i=0°, $\theta$ or $-\theta$.
  $t_s$: thickness of the skin,
  $t_g$: thickness of the panel equivalent to the grid
Data on the material:
  $E_x^s$, $E_y^s$: Young's modulus of the skin,
  $G_{xy}^s$: shear modulus of the skin,
  $v_{xy}^s$, $v_{yx}^s$: Poisson coefficient of the skin,
  $E^{st}$: Young's modulus of the stiffeners,
  $v^{st}$: Poisson coefficient of the stiffeners
  Material data (n: Ramberg & Osgood coefficient, Fcy, Ftu, $v_{plast}$=0.5)
Loads applied on the structure ($N_x^0$, $N_y^0$, $N_{xy}^0$)
The data obtained at the end of this step are:
$N_x^s$, $N_y^s$, $N_{xy}^s$: flow in the skin, $\sigma_x^s$, $\sigma_y^s$, $\tau_{xy}^s$: stresses in the skin, $\sigma_{0°}$, $\sigma_\theta$, $\sigma_{-\theta}$: stresses in the stiffeners, $F_{0°}$, $F_\theta$, $F_{-\theta}$: loads in the stiffeners.

In the following part of the description, the skin is assumed to be of an isotropic material.

The method provides entries for:

The analysis of resistance (step 4): stresses in the skin and in the stiffeners the analysis of pocket buckling (step 5.1): stresses in the skin the analysis of stiffener buckling (step 5.2): stresses in the stiffeners the analysis of general instability (step 6): stresses in the skin and in the stiffeners to calculate the bending rigidity of the panel stiffened by triangular pockets.

The calculation method requires entry data on the post-buckling of stiffeners: $A_{0°}^{st}$, $A_{+\theta}^{st}$ and $A_{-\theta}^{st}$ and on post-buckling of pockets: $t_{s\_eff}$ The method takes into account the redistribution of applied stresses between the panel and the grid of stiffeners due in the first instance, to the post-buckling of the stiffeners, by the definition of an effective straight section for each type of stiffener (0°, +θ or −θ): $A_{0°}^{st}$, $A_{+\theta}^{st}$ and $A_{-\theta}^{st}$, and in the second instance, to the post-buckling of the pocket through an effective thickness of the panel: $t_{s\_eff}$, finally, to the plasticity of applied external loads, using an iterative process on the different properties of the material: $E_{0°}^{st}$, $E_{+\theta}^{st}$, $E_{-\theta}^{st}$ for the stiffeners and $E_x^s$, $E_y^s$ and $\nu_{ep}$ for the skin.

The external load is assumed to be in the plane of the panel and applied at the centre of gravity of the section:

$$\begin{Bmatrix} N \\ M \end{Bmatrix} = \begin{bmatrix} A & B \\ B & C \end{bmatrix} \cdot \begin{Bmatrix} \varepsilon \\ \kappa \end{Bmatrix}$$

therefore: $\varepsilon \neq 0$ and $\kappa = 0 \rightarrow$ $$\{N\} = [A] \cdot \{\varepsilon\} \text{ with } \{N\} = \begin{Bmatrix} Nx \\ Ny \\ Nxy \end{Bmatrix}$$

In consequence, the stresses in the skin do not depend on the thickness of said skin and the position in the plane. Also, stresses in the stiffeners do not depend on the position on the section of the stiffener, but only on the angle of the stiffener.

The geometric definition of the grid of stiffeners used for carrying out calculations is defined in FIG. 11:

To obtain a panel stiffened by triangular pockets, this elementary shape is associated with the skin and is repeated as many times as is required. Because of this, this method does not take into account the concept of the geometry of the edges.

For each stiffener, the real section ($A_i^{st}$ with i: 0°, +θ or −θ) is given by the ratio: $A_i^{st}=\% A_i \times A^{st}$ (in the present non-limitative example, only the case of $\% A_i=1$ is envisaged).

The straight section of the stiffeners includes the section of the radius of the pocket $$\left(2 \cdot R_f^2 \left(1 - \frac{\pi}{4}\right)\right).$$

Whatever their position on the grid, the stresses and strains are identical for each type of stiffener (0°, +θ, −θ).

To take into account the plasticity which can occur in each stiffener, the Young's modulus is specific to each type of stiffener (0°, +θ, −θ): $E_{0°}^{st}$, $E_\theta^{st}$, $E_{-\theta}^{st}$.

The "material" matrix E is defined by:

$$\overline{\overline{E_g}} = \begin{pmatrix} E_{0°}^{st} & 0 & 0 \\ 0 & E_\theta^{st} & 0 \\ 0 & 0 & E_{-\theta}^{st} \end{pmatrix}.$$

Figure 16:
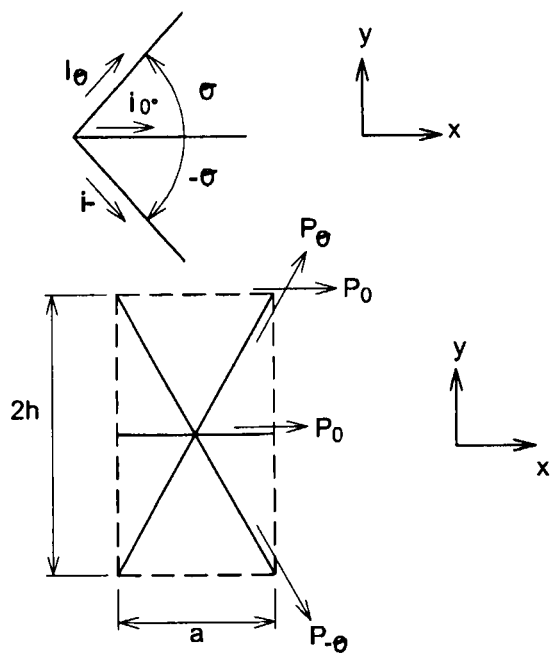

Step 3—Calculation of Internal Loads 3.1 Plate Equivalent to the Stiffeners 3.1.1 Relation Between Global Strains and Stiffener Strains The geometric notations and conventions are illustrated by FIG. 16. We are looking for the relation between ($\epsilon_x$, $\epsilon_y$, $\epsilon_{xy}$) and ($\epsilon_{0°}$, $\epsilon_\theta$, $\epsilon_{-\theta}$). General strains are defined by the following formulas:

$$\epsilon_{nn} = \vec{n} \cdot \overline{\overline{\epsilon}} \cdot \vec{n}$$

Therefore our strains are:

$$\varepsilon_{0°} = \vec{i_{0°}} \cdot \overline{\overline{\varepsilon}} \cdot \vec{i_{0°}} = (1\ 0\ 0) \cdot \begin{pmatrix} \varepsilon_{xx} & \varepsilon_{xy} & \varepsilon_{xz} \\ \varepsilon_{yx} & \varepsilon_{yy} & \varepsilon_{yz} \\ \varepsilon_{zx} & \varepsilon_{zy} & \varepsilon_{zz} \end{pmatrix} \cdot \begin{pmatrix} 1 \\ 0 \\ 0 \end{pmatrix}$$

$$\varepsilon_\theta = \vec{i_\theta} \cdot \overline{\overline{\varepsilon}} \cdot \vec{i_\theta} = (\cos\theta\ \sin\theta\ 0) \cdot \begin{pmatrix} \varepsilon_{xx} & \varepsilon_{xy} & \varepsilon_{xz} \\ \varepsilon_{yx} & \varepsilon_{yy} & \varepsilon_{yz} \\ \varepsilon_{zx} & \varepsilon_{zy} & \varepsilon_{zz} \end{pmatrix} \cdot \begin{pmatrix} \cos\theta \\ \sin\theta \\ 0 \end{pmatrix}$$

$$\varepsilon_{-\theta} = \vec{i_{-\theta}} \cdot \overline{\overline{\varepsilon}} \cdot \vec{i_{-\theta}} = (\cos\theta\ -\sin\theta\ 0) \cdot \begin{pmatrix} \varepsilon_{xx} & \varepsilon_{xy} & \varepsilon_{xz} \\ \varepsilon_{yx} & \varepsilon_{yy} & \varepsilon_{yz} \\ \varepsilon_{zx} & \varepsilon_{zy} & \varepsilon_{zz} \end{pmatrix} \cdot \begin{pmatrix} \cos\theta \\ -\sin\theta \\ 0 \end{pmatrix}$$

And finally:

$$\begin{pmatrix} \varepsilon_{0°} \\ \varepsilon_\theta \\ \varepsilon_{-\theta} \end{pmatrix} = \begin{pmatrix} 1 & 0 & 0 \\ \cos^2\theta & \sin^2\theta & 2\sin\theta\cos\theta \\ 2\cos^2\theta & 2\sin^2\theta & -2\sin\theta\cos\theta \end{pmatrix} \cdot \begin{pmatrix} \varepsilon_x \\ \varepsilon_y \\ \varepsilon_{xy} \end{pmatrix} \quad \text{Equation 3-1}$$

The above matrix is denoted Z:

$$\overline{\overline{Z}} = \begin{pmatrix} 1 & 0 & 0 \\ \cos^2\theta & \sin^2\theta & 2\sin\theta\cos\theta \\ 2\cos^2\theta & 2\sin^2\theta & -2\sin\theta\cos\theta \end{pmatrix}$$

3.1.2 Relation Between Stresses and Strains

As stated, the geometric notations and conventions are illustrated by FIG. 16. The loads in stiffeners are given by the following expressions:

$$\vec{P}_i = \epsilon_i \cdot E_{st} \cdot A_i^{st} \cdot \vec{i}_i, \ (i=0°,\theta,-\theta) \quad \text{Equation 3-2}$$

Therefore the base element below is subjected to: $\vec{P}_{0°}, \vec{P}_\theta, \vec{P}_{-\theta}$, ($\vec{P}_{0°}$ counted twice because the dimension of the base element according axis Y is 2h, therefore the stiffener corresponding to 0° should also be taken into account).

According to axis x:

$$P_x^g = \sum_l \vec{P}_l \cdot \vec{x} =$$

$$(2\overrightarrow{P_{0°}} + \overrightarrow{P_\theta} + \overrightarrow{P_{-\theta}}) \cdot \vec{x} = 2E_{0°}^{st} A_{0°}^{st} \varepsilon_{0°} + E_\theta^{st} A_\theta^{st} \varepsilon_\theta \cos\theta + E_{-\theta}^{st} A_{-\theta}^{st} \varepsilon_{-\theta} \cos\theta$$

According to axis y:

$$P_y^g = E_\theta^{st} A_\theta^{st} \varepsilon_\theta \sin\theta + E_{-\theta}^{st} A_{-\theta}^{st} \varepsilon_{-\theta} \sin\theta$$

Shear load in the plane $(\vec{x}, \vec{y})$:

$$P_{xy}^g = E_\theta^{st} A_\theta^{st} \varepsilon_\theta \sin\theta - E_{-\theta}^{st} A_{-\theta}^{st} \varepsilon_{-\theta} \sin\theta \qquad \text{Equation 3-3}$$

To obtain the stresses, the load is divided by the surface of a base element. The section of the base element on a normal surface according to axis X is $2ht_g = a\tan\theta \cdot t_g$. The section of the base element on a normal surface according to axis Y is $at_g$.

In terms of stresses we have:

$$\sigma_x^g = \frac{P_x^g}{2ht_g} = \frac{1}{2ht_g}\left(2E_{0°}^{st} A_{0°}^{st} \quad E_\theta^{st} A_\theta^{st} \cos\theta \quad E_{-\theta}^{st} A_{-\theta}^{st} \cos\theta\right) \cdot \begin{pmatrix} \varepsilon_{0°} \\ \varepsilon_\theta \\ \varepsilon_{-\theta} \end{pmatrix}$$

$$\sigma_x^g = \frac{1}{at_g}\left(\frac{2E_{0°}^{st} A_{0°}^{st}}{\tan\theta} \quad E_\theta^{st} A_\theta^{st} \frac{\cos^2\theta}{\sin\theta} \quad E_{-\theta}^{st} A_{-\theta}^{st} \frac{\cos^2\theta}{\sin\theta}\right) \cdot \begin{pmatrix} \varepsilon_{0°} \\ \varepsilon_\theta \\ \varepsilon_{-\theta} \end{pmatrix}$$

For $\sigma_y$ and $\tau_{xy}$, we obtain with the same method:

$$\sigma_y^g = \frac{1}{at_g}\left(0 \quad E_\theta^{st} A_\theta^{st} \sin\theta \quad E_{-\theta}^{st} A_{-\theta}^{st} \sin\theta\right) \cdot \begin{pmatrix} \varepsilon_{0°} \\ \varepsilon_\theta \\ \varepsilon_{-\theta} \end{pmatrix}$$

$$\tau_{xy}^g = \frac{1}{at_g}\left(0 \quad E_\theta^{st} A_\theta^{st} \sin\theta \quad E_{-\theta}^{st} A_{-\theta}^{st} \sin\theta\right) \cdot \begin{pmatrix} \varepsilon_{0°} \\ \varepsilon_\theta \\ \varepsilon_{-\theta} \end{pmatrix}$$

The same results can be presented in matrix form:

$$\begin{pmatrix} \sigma_x^g \\ \sigma_y^g \\ \tau_{xy}^g \end{pmatrix} = \qquad \text{Equation 3-4}$$

$$\frac{1}{at_g}\begin{pmatrix} \dfrac{2E_{0°}^{st} A_{0°}^{st}}{\tan\theta} & E_\theta^{st} A_\theta^{st} \dfrac{\cos^2\theta}{\sin\theta} & E_{-\theta}^{st} A_{-\theta}^{st} \dfrac{\cos^2\theta}{\sin\theta} \\ 0 & E_\theta^{st} A_\theta^{st} \sin\theta & E_{-\theta}^{st} A_{-\theta}^{st} \sin\theta \\ 0 & E_\theta^{st} A_\theta^{st} \sin\theta & E_{-\theta}^{st} A_{-\theta}^{st} \sin\theta \end{pmatrix} \cdot \begin{pmatrix} \varepsilon_{0°} \\ \varepsilon_\theta \\ \varepsilon_{-\theta} \end{pmatrix}$$

The above matrix is denoted $\overline{\overline{T}}$:

$$\overline{\overline{T}} = \frac{1}{at_g}\begin{pmatrix} \dfrac{2E_{0°}^{st} A_{0°}^{st}}{\tan\theta} & E_\theta^{st} A_\theta^{st} \dfrac{\cos^2\theta}{\sin\theta} & E_{-\theta}^{st} A_{-\theta}^{st} \dfrac{\cos^2\theta}{\sin\theta} \\ 0 & E_\theta^{st} A_\theta^{st} \sin\theta & E_{-\theta}^{st} A_{-\theta}^{st} \sin\theta \\ 0 & E_\theta^{st} A_\theta^{st} \sin\theta & -E_{-\theta}^{st} A_{-\theta}^{st} \sin\theta \end{pmatrix}$$

Thus by using Equation 3-1 and the Z matrix notation:

$$\begin{pmatrix} \sigma_x^g \\ \sigma_y^g \\ \tau_{xy}^g \end{pmatrix} = \overline{\overline{T}} \cdot \overline{\overline{Z}} \cdot \begin{pmatrix} \varepsilon_x \\ \varepsilon_y \\ \varepsilon_{xy} \end{pmatrix} \qquad \text{Equation 3-5}$$

The previous matrix is denoted W: $\overline{\overline{W}} = \overline{\overline{T}} \cdot \overline{\overline{Z}}$ This relation (Equation 3-5) signifies that the behaviour of the panel equivalent to the stiffeners is similar to an anisotropic material (the W matrix can be completed: all these cells have non-null values).

3.2 Stiffened Panels

Figure 15:
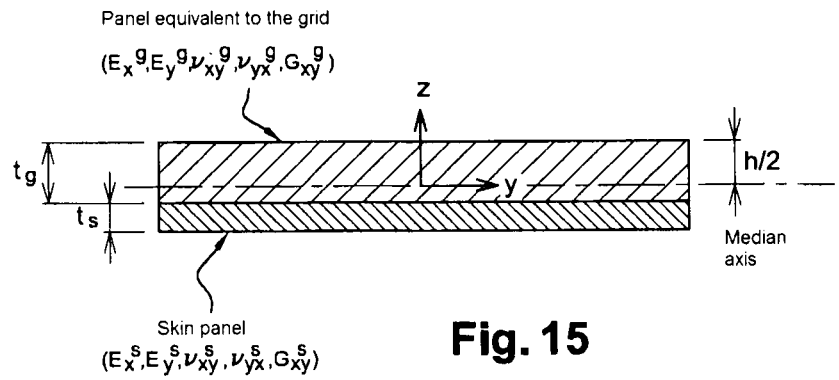

We use the Kirchhoff hypothesis: plane sections remain plane after straining. The network of stiffeners is modelled by an equivalent panel with a W matrix behaviour (see Equation 3-5). This disposition of modelling a panel stiffened by triangular pockets, by two orthotropic plates is illustrated by FIG. 15.

For the calculation of $\nu_{yx}$, we have:

$$\frac{\nu_{xy}^s}{E_x^s} = \frac{\nu_{yx}^s}{E_y^s}$$

3.2.1. Stresses and Loads of Stiffeners

Flow in the Panel Equivalent to the Stiffeners

The general expression of flows is:

$$N_{\alpha\beta} = \int_h \sigma_{\alpha\beta} dz \qquad \text{Equation 3-6}$$

The flow according to axis X is expressed as follows:

$$N_{xx} = \int_h \sigma_{xx} dz = \int_{-\frac{h}{2}}^{-\frac{h}{2}+t_s} \sigma_{xx}^g dz + \int_{-\frac{h}{2}+t_s}^{\frac{h}{2}} \sigma_{xx}^g dz$$

$$N_{xx} = \frac{E_x^s t_s}{1-\nu_{xy}^s \nu_{yx}^s} \cdot \varepsilon_{xx} + \frac{\nu_{xy}^s E_y^s t_s}{1-\nu_{xy}^s \nu_{yx}^s} \cdot \varepsilon_{yy} + \sigma_{xx}^g \cdot t_g$$

by using Equation 3-5:

$$N_x = \left[\frac{E_x^s t_s}{1-\nu_{xy}^s \nu_{yx}^s} + t_g \cdot \overline{\overline{W}}_{1,1}\right] \cdot \varepsilon_x + \left[\frac{\nu_{xy}^s E_x^s t_s}{1-\nu_{xy}^s \nu_{yx}^s} + t_g \cdot \overline{\overline{W}}_{1,2}\right] \cdot \varepsilon_y +$$

$$t_g \cdot \overline{\overline{W}}_{1,3} \cdot \varepsilon_{xy}$$

And, by using the same method for the $N_y$ and $N_{xy}$ flows.

$$N_y = \left[\frac{\nu_{yx}^s E_x^s t_s}{1-\nu_{xy}^s \nu_{yx}^s} + t_g \cdot \overline{\overline{W}}_{2,1}\right] \cdot \varepsilon_x + \qquad \text{Equation 3-7}$$

$$\left[\frac{E_y^s t_s}{1-\nu_{xy}^s \nu_{yx}^s} + t_g \cdot \overline{\overline{W}}_{2,2}\right] \cdot \varepsilon_y + t_g \cdot \overline{\overline{W}}_{2,3} \cdot \varepsilon_{xy}$$

$$N_{xy} = t_g \cdot \overline{\overline{W}}_{3,2} \cdot \varepsilon_x + t_g \cdot \overline{\overline{W}}_{3,3} \cdot \varepsilon_y + (2G_{xy}t_s + t_g \cdot \overline{\overline{W}}_{3,1})\varepsilon_{xy}$$

These expressions clearly show the distribution of flow between the skin and the panel equivalent to the stiffeners. In the skin, the relation between the flows and strains is:

$$\begin{pmatrix} N_x^s \\ N_y^s \\ N_{xy}^s \end{pmatrix} = \qquad \text{Equation 3-8}$$

$$\begin{pmatrix} N_x \\ N_y \\ N_{xy} \end{pmatrix} - \begin{pmatrix} N_x^g \\ N_y^g \\ N_{xy}^g \end{pmatrix} = \begin{pmatrix} \frac{E_x^s t_s}{1-\nu_{xy}^s \nu_{yx}^s} & \frac{\nu_{xy}^s E_y^s t_s}{1-\nu_{xy}^s \nu_{yx}^s} & 0 \\ \frac{\nu_{xy}^s E_x^s t_s}{1-\nu_{xy}^s \nu_{yx}^s} & \frac{E_y^s t_s}{1-\nu_{xy}^s \nu_{yx}^s} & 0 \\ 0 & 0 & 2G_{xy}^s t_s \end{pmatrix}$$

We note X the previous matrix:

$$\overline{\overline{X}} = \begin{pmatrix} \frac{E_x^s t_s}{1-\nu_{xy}^s \nu_{yx}^s} & \frac{\nu_{xy}^s E_y^s t_s}{1-\nu_{xy}^s \nu_{yx}^s} & 0 \\ \frac{\nu_{xy}^s E_x^s t_s}{1-\nu_{xy}^s \nu_{yx}^s} & \frac{E_y^s t_s}{1-\nu_{xy}^s \nu_{yx}^s} & 0 \\ 0 & 0 & 2G_{xy}^s t_s \end{pmatrix}$$

Thus:

$$\begin{pmatrix} N_x \\ N_y \\ N_{xy} \end{pmatrix} = \begin{pmatrix} N_x^g \\ N_y^g \\ N_{xy}^g \end{pmatrix} + \frac{1}{t_g} \cdot \overline{\overline{X}} \cdot \overline{\overline{W}}^{-1} \cdot \begin{pmatrix} N_x^g \\ N_y^g \\ N_{xy}^g \end{pmatrix} \qquad \text{Equation 3-9}$$

By inversing this relation, the flows in the grid are expressed according to the globally applied flows:

$$\begin{pmatrix} N_x^g \\ N_y^g \\ N_{xy}^g \end{pmatrix} = V \cdot \begin{pmatrix} N_x \\ N_y \\ N_{xy} \end{pmatrix} \qquad \text{Equation 3-10}$$

With:

$$\overline{\overline{V}} = \left(\overline{\overline{I_d}} + \frac{1}{t_g} \cdot \overline{\overline{X}} \cdot \overline{\overline{W}}^{-1}\right)^{-1} \quad (\overline{\overline{I_d}} \text{ is the identity matrix})$$

Stresses and Loads in Stiffeners

The flow in the panel equivalent to the stiffeners can be expressed by:

$$\begin{pmatrix} N_x^g \\ N_y^g \\ N_{xy}^g \end{pmatrix} = t_g \cdot \overline{\overline{T}} \cdot \begin{pmatrix} \varepsilon_{0°} \\ \varepsilon_\theta \\ \varepsilon_{-\theta} \end{pmatrix} \qquad \text{Equation 3-11}$$

$$\begin{pmatrix} N_x^g \\ N_y^g \\ N_{xy}^g \end{pmatrix} = t_g \cdot \overline{\overline{T}} \cdot \overline{\overline{E_g}}^{-1} \cdot \begin{pmatrix} \sigma_{0°} \\ \sigma_\theta \\ \sigma_{-\theta} \end{pmatrix} \qquad \text{Equation 3-12}$$

By using the following notation: $\overline{\overline{U}} = t_g \cdot \overline{\overline{T}} \cdot \overline{\overline{E_g}}^{-1}$ We have:

$$\begin{pmatrix} \sigma_{0°} \\ \sigma_\theta \\ \sigma_{-\theta} \end{pmatrix} = U^{-1} \cdot \begin{pmatrix} N_x^g \\ N_y^g \\ N_{xy}^g \end{pmatrix} \qquad \text{Equation 3-13}$$

Finally, the loads and stresses in the stiffeners are expressed according to the flows of external loads:

$$\begin{pmatrix} \sigma_{0°} \\ \sigma_\theta \\ \sigma_{-\theta} \end{pmatrix} = U^{-1} \cdot V \cdot \begin{pmatrix} N_x \\ N_y \\ N_{xy} \end{pmatrix} \text{ and } \begin{pmatrix} F_{0°} \\ F_\theta \\ F_{-\theta} \end{pmatrix} = \begin{pmatrix} A_{0°}^{st} \\ A_\theta^{st} \\ A_{-\theta}^{st} \end{pmatrix} \cdot \begin{pmatrix} \sigma_{0°} \\ \sigma_\theta \\ \sigma_{-\theta} \end{pmatrix} \qquad \text{Equation 3-14}$$

3.2.2 Flows and Stresses in the Skin

As shown by Equation 3-8, flows in the skin are expressed as below:

$$\begin{pmatrix} N_x^s \\ N_y^s \\ N_{xy}^s \end{pmatrix} = \begin{pmatrix} N_x \\ N_y \\ N_{xy} \end{pmatrix} - \begin{pmatrix} N_x^g \\ N_y^g \\ N_{xy}^g \end{pmatrix} \qquad \text{Equation 3-15}$$

thus, the stresses in the skin are expressed by:

$$\begin{pmatrix} \sigma_x^s \\ \sigma_y^s \\ \tau_{xy}^s \end{pmatrix} = \frac{1}{t_s} \cdot \begin{pmatrix} N_x^s \\ N_y^s \\ N_{xy}^s \end{pmatrix} \qquad \text{Equation 3-16}$$

Figure 17:
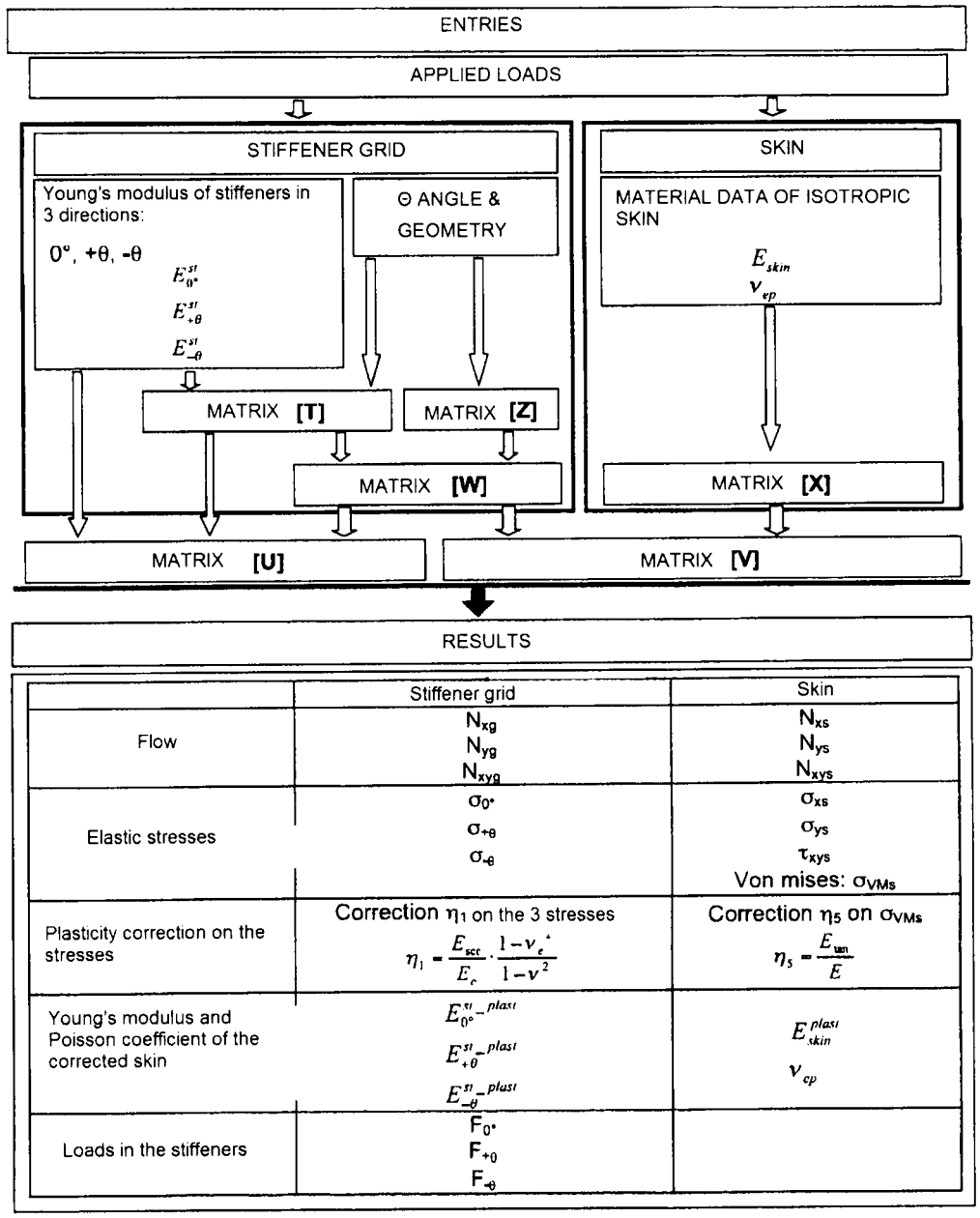

3.3 The method of calculating plasticity corrected applied loads is presented here with references to the matrices introduced in the description (FIG. 17).

We note that the theory used for calculating plasticity supposes the isotropic quality of the skin which forms the skin. The solution for plasticity corrected applied loads is provided by an iterative method.

A process of convergence must be carried out until the five material parameters ($E_{0°}^{st}$, $E_{+\theta}^{st}$, $E_{-\theta}^{st}$, $E_{skin}$, $\nu_{ep}$) entered at the start of the iterative process are equal to the same parameters calculated at the exit (after calculation of plastic stress). In FIG. 17, already cited, the convergence parameters are indicated by a grey background.

More precisely, in this iterative process, the initial entries are the loads applied in the grid of stiffeners and in the skin.

For the grid of stiffeners, the data of the $n^{th}$ iteration of Young's modulus of stiffeners $E_{0°}^{st}$, $E_{+\theta}^{st}$, $E_{-\theta}^{st}$ in 3 directions: 0°, +θ, −θ, make it possible, in association with the value of the angle θ and the geometry, to calculate the matrix [T] (equation 3-4). The values of the angle θ and geometry supplying the matrix [Z] (equation 3-1). The matrices [T] and [Z] giving the matrix [W] (equation 3-5).

For the skin, the material data of the isotropic skin $E_{skin}$, $\nu_{ep}$) make it possible to calculate the matrix [X] (equation 3-8).

The [W] and [X] matrices make it possible to calculate the [U] (equation 3-13) and [V] matrices (equation 3-10).

The results drawn from these matrices include: the flows, elastic stresses, plasticity corrections on stresses, the values of the $n^{th}+1$ iteration of the Young's modulus of corrected stiffeners and skin, and of the Poisson coefficient of the corrected skin, and the loads in the stiffeners.

We understand that the calculation is iterated until the Young's modulus and Poisson coefficients vary during an iteration of a value which is lower than a predetermined threshold.

Impact of Plasticity Correction on the Calculation of General Buckling:

Naturally, plasticity correction changes the behaviour law matrix calculated in the general instability modulus throughout the 5 material parameters (see the section on general instability).

$$\begin{pmatrix} N_{xx} \\ N_{yy} \\ N_{xy} \\ -M_{xx} \\ M_{yy} \\ -M_{xy} \end{pmatrix} = \begin{pmatrix} \overline{\overline{A}} & \overline{\overline{B}} \\ \overline{\overline{B}} & \overline{\overline{C}} \end{pmatrix} \cdot \begin{pmatrix} \varepsilon_{xx}^0 \\ \varepsilon_{yy}^0 \\ \varepsilon_{xy}^0 \\ \kappa_{xx} \\ \kappa_{yy} \\ \kappa_{xy} \end{pmatrix} =$$

Equation 3-17

$$\begin{pmatrix} A_{11} & A_{12} & A_{13} & B_{11} & B_{12} & B_{13} \\ A_{12} & A_{22} & A_{23} & B_{12} & B_{22} & B_{23} \\ A_{13} & A_{23} & A_{11} & B_{13} & B_{23} & B_{33} \\ B_{11} & B_{12} & B_{13} & C_{11} & C_{12} & C_{13} \\ B_{12} & B_{11} & B_{23} & C_{12} & C_{22} & C_{23} \\ B_{13} & B_{23} & B_{33} & C_{13} & C_{23} & C_{33} \end{pmatrix} \cdot \begin{pmatrix} \varepsilon_{xx}^0 \\ \varepsilon_{yy}^0 \\ \varepsilon_{xy}^0 \\ \kappa_{xx} \\ \kappa_{yy} \\ \kappa_{xy} \end{pmatrix}$$

Because of this, plasticity correction also alters the coefficients $\Omega_i$ (i=1 . . . 3) used for calculating general buckling. Plasticity correction in the analysis of general buckling is provided by these modified coefficients $\Omega_i$.

3.4 Example: Distribution of Loads Under Bi-Compression and Shear Load

In the step of calculating the applied stresses the radius of the pocket fillet is taken into account for the calculation of the stiffener section. In addition, there is no post-buckling, we can therefore write:

$$\%A_{0°}^{st} = \%A_{+e}^{st} = \%A_{-e}^{st} = 100\%$$

$$t_{s\_eff} = t_s$$

In the present non-limitative example described herein, the geometry of the panel stiffened by triangular pockets is defined by:

| | | |
|---|---|---|
| $L_x$ = 1400.45 mm | a = 198 mm | node radius: $R_n$ = 9 mm |
| $L_y$ = 685.8 mm | t = 3.64 mm | pocket radius: $R_f$ = 4 mm |
| θ = 58° | b = 2.5 mm | d = 37.36 mm |

We consider an isotropic material. The elasto-plastic law used is that of Ramberg & Osgood.

| | |
|---|---|
| E | 78000 |
| Nu | 0.3 |
| Ftu | 490 |
| Fty | 460 |
| e % | 20% |
| n | 40 |

$N_x$=−524.65N/mm
$N_y$=−253.87N/mm
$N_{xy}$=327.44N/mm

The method of calculating internal loads and applied loads including plasticity correction is written in the form of a matrix:

| W = T*Z | | | | | |
|---|---|---|---|---|---|
| sigxg | | 1518 | 504 | 0 | epsx |
| sigyg | = | 504 | 1290 | 0 | * epsy |
| tauxyg | | 0 | 0 | 504 | gamxy |

| X | | | | | |
|---|---|---|---|---|---|
| Nx-Nxg | | 312000 | 93600 | 0 | epsx |
| Ny-Nyg | = | 93600 | 312000 | 0 | * epsy |
| Nxy-Nxyg | | 0 | 0 | 109200 | gamxy |

| V | | | | | |
|---|---|---|---|---|---|
| Nxg | | 0.152 | 0.005 | 0.000 | Nx |
| Nyg | = | 0.011 | 0.130 | 0.000 | * Ny |
| Nxyg | | 0.000 | 0.000 | 0.147 | Nxy |

| $U^{-1}$ | | | | | |
|---|---|---|---|---|---|
| sig 0° | | 1.580 | −0.617 | 0.000 | Nxg |
| sig +theta | = | 0.000 | 1.164 | 1.863 | * Nyg |
| sig -theta | | 0.000 | 1.164 | −1.863 | Nxyg |

The obtained results are therefore the flows, stresses and loads in the stiffeners:

| | | |
|---|---|---|
| $N_{xg}$ = −81.1 N/mm | $\sigma_{0°}$ = −101.14 MPa | $F_{0°}$ = −104417 N |
| $N_{yg}$ = −39 N/mm | $\sigma_{+\theta}$ = 44.25 MPa | $F_{+\theta}$ = 4437 N |
| $N_{xyg}$ = 48.1 N/mm | $\sigma_{-\theta}$ = −35.07 MPa | $F_{-\theta}$ = −13537 N |

As well as the flows and stresses in the skin:

$N_{xs}$=−443.5N/mm $\sigma_{xs}$=−121.85 MPa
$N_{ys}$=−214.87N/mm $\sigma_{ys}$=−59.03 MPa
$N_{xys}$=279.3N/mm $\tau_{xy}$=76.74 MPa In this example, the applied stresses reside in the elastic domain.

The flow distribution between the skin and the grid of stiffeners is summarised by the following table:

| Flow | External | Distribution of loads - flows | | Distribution of loads - percentages | |
|---|---|---|---|---|---|
| (N/mm) | flows | Grid | Skin | Grid | Skin |
| Nx | −524.65 | −81.13 | −443.52 | 15.46% | 84.54% |
| Ny | −253.87 | −39.00 | −214.87 | 15.36% | 84.64% |
| Nxy | +327.44 | +48.12 | +279.32 | 14.7% | 85.3% |

Step 4—Resistance Analysis Module:

This phase is aimed at calculating the reserve factors (RF) by comparison with the applied loads calculated in the components of the panel stiffened by triangular pockets, and the maximum stress capacity of the material.

The stress capacities in the ultimately loaded material are determined by: $F_{tu}$ (the material's ultimate tension resistance) compared to the stresses applied in the stiffener webs, $F_{tu}$ compared to the principal stresses applied in the skin, $F_{su}$ (the material's ultimate shear resistance) compared to the maximum shear capacity in the skin.

Analysis of resistance consists of calculating the reserve factors of the limit loaded and ultimate loaded material. The applied stresses come from loads in the plane (compression, shear load) or outside of the plane (pressure).

The entry data for this calculation are:
Capacity values for the material: $F_{ty}$, $F_{cy}$, $F_{sy}$, $F_{tu}$, $F_{su}$
Stresses applied to the structure:
  Stresses on the skin ($\sigma_{xs}$, $\sigma_{ys}$ et $\tau_{xys}$)
  Normal stresses in the stiffeners
Note: applied stresses are corrected for plasticity in the applied stress calculation method, as was stated above.
The exit data are the reserve factors.
The analysis of resistance in the plane of the panel is based on the following hypotheses. The stresses in the skin do not depend on the thickness of the skin and the position in the plane. The stresses in a stiffener do not depend on the position on the section of the stiffener, but only on the angle of the stiffener.

These hypotheses are not valid when post-buckling and behaviour outside of the plane are equally taken into account. In these cases, the max/min functions, of known types, must be implemented to take into account these phenomena.

Calculation of Principal Stresses:
To calculate the skin's reserve factor, the principal stresses ($\sigma_{max}$, $\sigma_{min}$ and $\tau_{max}$) are used:

$$\sigma_{max\_s} = \frac{\sigma_{xs} + \sigma_{ys}}{2} + \sqrt{\frac{(\sigma_{xs} - \sigma_{ys})^2}{2} + \tau_{xys}^2} \quad \text{Equation 4-1}$$

$$\sigma_{min\_s} = \frac{\sigma_{xs} + \sigma_{ys}}{2} - \sqrt{\frac{(\sigma_{xs} - \sigma_{ys})^2}{2} + \tau_{xys}^2}$$

$$\tau_{max} = \frac{\sigma_{max\_s} - \sigma_{min\_s}}{2}$$

The value $\sigma_{max}$ used in the calculation of the reserve factor is defined as the absolute maximum between $\sigma_{max\_s}$ and $\sigma_{min\_s}$ calculated in Error! Reference source not found.1.

Reserve Factor at Load Limit (LL):
Reserve factor on the stiffener webs:

$$RF_{in\_plane\_LL}^{blade\_0} = \frac{F_y}{\sigma_{blade\_0\_LL}}$$

$$RF_{in\_plane\_LL}^{blade\_+\theta} = \frac{F_y}{\sigma_{blade\_+\theta\_LL}}$$

$$RF_{in\_plane\_LL}^{blade\_-\theta} = \frac{F_y}{\sigma_{blade\_-\theta\_LL}}$$

Reserve factor on the skin:
  Shear capacity:

$$RF_{in\_plane\_LL}^{skin\_shear} = \frac{F_{xy}}{\tau_{max\_LL}}$$

In this formula, if $F_{sy}$ is unknown, $F_{su}/\sqrt{3}$ can be used
Principal stress:

$$RF_{in\_plane\_LL}^{skin} = \frac{F_y}{\sigma_{max\_LL}}$$

An envelope reserve factor is calculated at load limit:

$$RF_{material\_LL} = \min\{RF_{in\_plane\_LL}^{blade\_0}; RF_{in\_plane\_LL}^{blade\_+\theta}; RF_{in\_plane\_LL}^{blade\_-\theta}; RF_{in\_plane\_LL}^{skin\_shear}; RF_{in\_plane\_LL}^{skin}\} \quad \text{Equation 4-2}$$

Reserve Factor at Ultimate Load UL:
Reserve factor on the stiffener webs:

$$RF_{in\_plane\_UL}^{blade\_0} = \frac{F_u}{\sigma_{blade\_0\_UL}} \quad (*)$$

$$RF_{in\_plane\_UL}^{blade\_+\theta} = \frac{F_u}{\sigma_{blade\_+\theta\_UL}} \quad (*)$$

$$RF_{in\_plane\_UL}^{blade\_-\theta} = \frac{F_u}{\sigma_{blade\_-\theta\_UL}} \quad (*)$$

Note: if $F_{cu}$ is unknown, $F_{cy}$ or $F_{tu}$ can be used
Reserve factor on the skin:
Maximum shear capacity:

$$RF_{in\_plane\_UL}^{skin\_shear} = \frac{F_{su}}{\tau_{max\_UL}}$$

Principal stress:

$$RF_{in\_plane\_UL}^{skin} = \frac{F_u}{\sigma_{max\_UL}}$$

An envelope reserve factor is calculated at ultimate load:

$$RF_{material\_UL} = \min\{RF_{in\_plane\_UL}^{blade\_0}; RF_{in\_plane\_UL}^{blade\_+\theta}; RF_{in\_plane\_UL}^{blade\_-\theta}; RF_{in\_plane\_UL}^{skin\_shear}; RF_{in\_plane\_UL}^{skin}\}$$

The analysis of resistance outside of the plane of the panel lies outside of the scope of the present invention.

In an example of an implementation of this part of the method for analysing resistance in the plane, the same geometry and the same case of loads as in the preceding sections is studied. In the first instance, the ratio of the loads factor is assumed to be equal to 1.

Reserve factor of the stiffener webs:
$RF_{in\_plane\_UL}^{blade\_0} = 4.71$
$RF_{in\_plane\_UL}^{blade\_+\theta} = 11.14$
$RF_{in\_plane\_UL}^{blade\_-\theta} = 3.63$
Reserve factor of the skin:
Calculation of principal stresses:
  $\sigma_{max\_s} = -7.52$ MPa
  $\sigma_{min\_s} = -173.35$ MPa
  $\tau_{max} = 82.91$ MPa
  $\Rightarrow \sigma_{max\_skin\_UL} = 173.35$ MPa
Shear capacity: $RF_{in\_plane\_UL}^{skin\_shear} = 3.41$
Principal stress: $RF_{in\_plane\_UL}^{skin} = 2.82$
Reserve factor envelope RF at ultimate load (UL)
$RF_{material\_UL} = 2.82$ In the case of plastic calculation, an iterative calculation is carried out until the applied loads reach the resistance failure load (in order to carry out plasticity correction on these). At each iteration loop, the same calculations as previously described are carried out.

Step 5—Calculating Local Stress Capacity,
Two types of instability weaken the global rigidity of the structure stiffened by triangular pockets, but do not cause the global failure of the complete structure
  Instability of the panel: buckling of triangular pockets
  Instability of stiffeners: buckling of stiffener webs
The buckled sections can only support a part of the load which they could support before they were buckled. Because of this, the applied loads are redistributed in the structure.

It is noted that in the present invention, post-buckling calculations are not processed. Because of this, the two types of buckling referred to above are considered as modes of failure.

5A—Calculation of the Panel's Local Buckling:

In panels stiffened by triangular pockets, the pockets are triangular plates subjected to combined loads in the plane. In order to calculate the buckling flow capacity and reserve factors under pure loading of the complete stiffened panel, a method based on a finite element model (FEM) is used.

This section provides a calculation of pocket buckling flow capacity for isosceles triangular pockets: the base of the triangle can vary between all values, and, in the present non-limitative example, between 45° and 70°. The flow calculation is carried out with two types of boundary conditions: simply supported and clamped The applied stresses to be taken into account for the calculation of the reserve factor are solely the stresses affecting the skin, and determined in the section, described above, of the applied stress calculation.

The entry data for this section are:
geometric data (base of the triangle, isosceles angle, thickness of the skin)
material data (linear (E, ν) and non-linear ($F_{cy}$, $F_{tu}$, e %, $n_c$))
uniquely isotropic material
the plastic buckling flow capacity values are only pertinent up to $F_{cy}$.
Boundary conditions: simply supported or clamped
Loads applied to the skin It should be noted that all the external flows used in this section are skin flows and do not correspond with a complete loading of the stiffened panel. In addition, the height of the triangle (h) used as reference length for the buckling calculation is reduced to the semi-thickness of stiffener webs.

In this section, the formula used for the height of the triangle is:

$$h = h\_red$$

$$h\_red = \frac{a\_red}{2} \cdot \tan\theta$$

$$a\_red = a - b \cdot \left[\frac{1}{\tan\theta} + \frac{1}{\sin\theta}\right]$$

The exit data are the following:
Pocket buckling capacity.
Reserve factor

This section is aimed at calculating the flow capacities for isosceles triangular plates.

It includes two parts: 1/ A calculation of capacity values for simply supported triangular plates (part 5A.5), 2/ A calculation of capacity values for clamped triangular plates (part 5A.6).

The two following parts follow the same approach: firstly a calculation of capacity values for triangular plates subject to cases of pure loading (compression according to X, compression according to Y and shear load), then a calculation of interaction curves between the three cases of pure loading.

5A.1 Calculation Principle

The cases of pure loading envisaged are presented in FIG. 12.

Several analytical formula methods for local buckling of triangles exist in written documentation. The comparison of these methods shows that there is a large difference between the previously cited buckling stresses. Moreover, some of the parameters used in these methods are derived from calculations by finite elements, tests are often empirical and certain methods provide absolutely no data for angles other than those of 60°.

The development of a complete theory of this problem being somewhat lengthy, the method such as is herein described, which is non-limitative, implements a method based entirely on a Finite Element Model (FEM):

Creating an FEM parametric model of a triangular plate (parameters: base angle, thickness, height of triangle, boundary conditions),
Testing various combinations to obtain linear results of buckling,
Obtaining the parameters which will be used in an analytical formula (coefficients K).

The induced plasticity effects must also be taken into account in the calculation of capacity values. The applied loads are either simple loads or combinations of these simple loads.

5A.2 Case of Pure Loading

Figure 18:
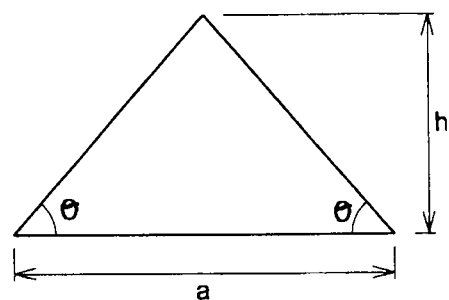

Interaction curves are defined as follows. Six finite element models of triangular plates were created with angles of between 45° and 70° in the present non-limitative example which concerns angles of the triangle. In this section, the isosceles angle (θ) is defined as the base angle of the isosceles triangle (see FIG. 18). For each isosceles angle and for each case of pure loading, the study is organised in three points:

1/ Calculation by Finite Element Model (FEM)

Linear calculations of local buckling of triangles by finite element model (FEM) of a known type were carried out to determine the wrinkle flow capacity (without plastic correction) for various thicknesses, and therefore various stiffnesses of a plate. We note that the first mode observed always presents a single buckle (a single lump).

2/ Tracing the Curve of Buckling Flow Capacity According to $$\frac{D}{h^2}$$

In general, in written documentation, the buckling flow capacity is expressed as follows:

$$N_{crit} = K \cdot \frac{D}{h^2}$$

K is a constant,
D the stiffness of the plate:

$$D = \frac{E \cdot t^3}{12(1 - \nu^2)},$$

h is the height of the triangle:

$$h = \frac{a}{2} \cdot \tan\theta.$$

But this study demonstrates that, in the case of triangular plates, and for the small values of the ratio $$\frac{D}{h^2},$$

an expression of the buckling flow capacity using a first degree equation in $$\frac{D}{h^2}$$

is not pertinent. Better results are obtained with a second degree equation in the following form:

$$N_{crit} = K_1 \left(\frac{D}{h^2}\right)^2 + K_2 \cdot \frac{D}{h^2} \text{(elastic value)} \qquad \text{Equation 5-1}$$

Constants $K_1$ and $K_2$ depend on the angle and the load case being considered. Therefore, for each case and each angle, a value for the $K_1$ and $K_2$ constants is obtained.

Figure 19:
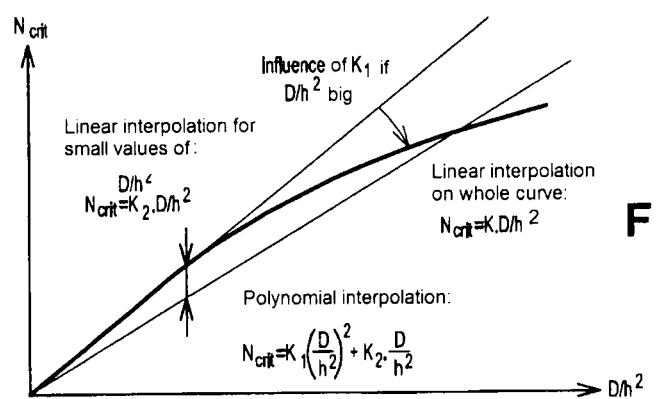
Figure 20:
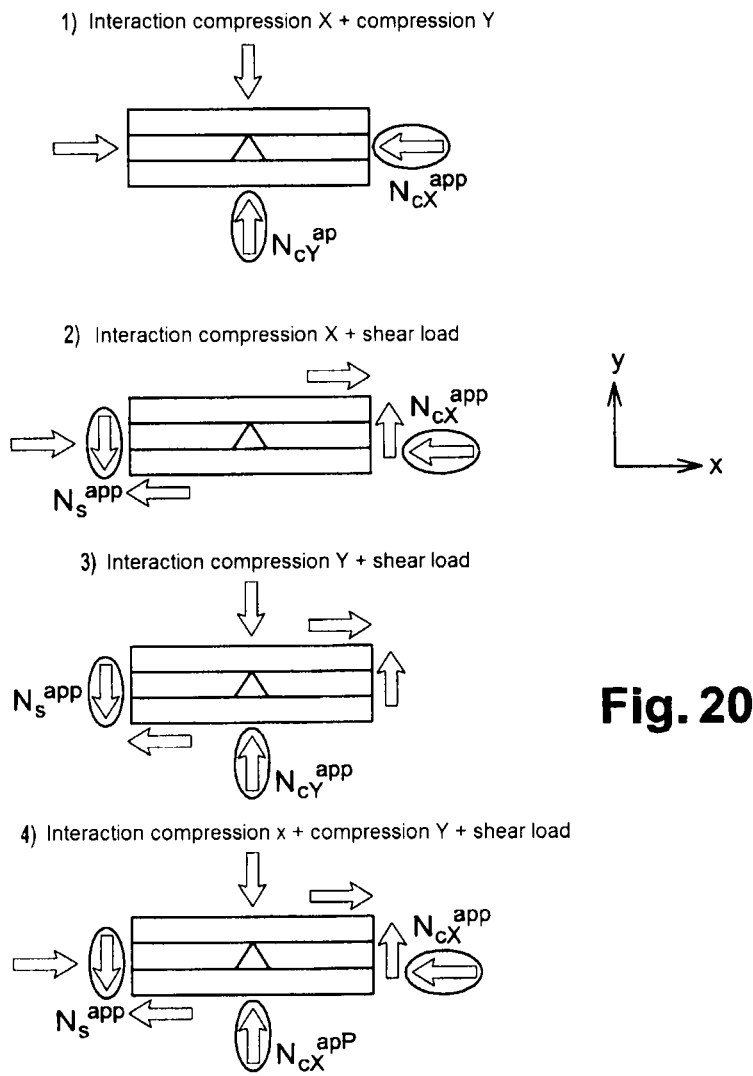

3/ Tracing the Evolution of $K_1$ and $K_2$ According to the Base Angle of the Isosceles Triangle $K_1$ and $K_2$ are traced according to the angle and an interpolation is carried out to determine a polynomial equation which makes it possible to calculate these constants of any angle between 45° and 70°. FIG. 19 illustrates a linear or quadratic interpolation for the K coefficients. It is clear that this function also makes it possible to extrapolate values outside of, but close to the domain going from 45 to 70°. Thus, by knowing the isosceles angle and the boundary conditions, it is possible to directly calculate the buckling flow capacity of the triangular plate being studied.

5A.3 Case of Combined Loading

In this case the following hypothesis is used: if some components of the combined load are under tension, these components are reduced to zero (are not taken into account for the calculation). It is, in effect, conservative to consider that the components under tension have no affect with regards to the buckling flow being studied, and do not improve the buckling stress on the plate. For example, if $N_x^{app}$=+200N/mm (which shows a tension) and $N_s^{app}$=300N/mm, the combined load capacity is reduced to the pure shear load capacity.

Figure 21:
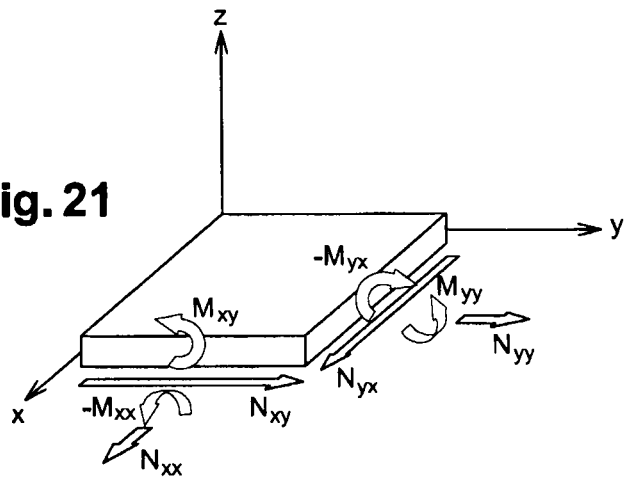

The presentation of the envisaged loading cases is illustrated in FIG. 21. In this section, three finite element models were used: three isosceles triangular plates with angles equal to 45°, 60° and 70°. For each angle, the study is organised in two points:

1/ Calculation by Finite Element Model (FEM)

For all the combinations presented below, linear calculations by finite element method were carried out to determine the eigenvalue of buckling corresponding to different distributions of external loads.

We can see that the first mode observed always presents a single blister.

It appears that the interaction curve depends little on the value of $$\frac{D}{h^2}.$$

2/ Tracing the Interaction Curves

The interaction curve is traced for each angle and each combination of loads. Next, the various curves are approximated with classical curves for which the calculation takes the following form:

$$R_1^A + R_2^B = 1$$

with $$R_i = \frac{N_i^{app}}{N_i^{crit}},$$

i=cX, cY or s.

The results and the choices made have shown that the equations of interaction curves do not depend on the base angle of the isosceles triangle and are therefore compatible and can be unified by a single equation covering all the combinations in the following form:

$$R_{cX}^A + R_{cY}^B + R_s^C = 1$$

Based on this equation, to determine the reserve factors, we can solve the following equation:

$$\left(\frac{R_{cY}}{R}\right)^A + \left(\frac{R_{cX}}{R}\right)^B + \left(\frac{R_s}{R}\right)^C = 1$$

with $$R = \frac{N_{cY}^{app}}{N_{cYcomb}^{crit}} = \frac{N_{cX}^{app}}{N_{cXcomb}^{crit}} = \frac{N_s^{app}}{N_{scomb}^{crit}} = \frac{1}{RF}$$

5A.4 Plasticity Correction Factor

Obtaining a plasticity correction for cases of pure loading, according to the isosceles angle and the boundary conditions is very complex. In fact, for triangular plates, deflection functions are complex and give rise to numerous digital integration problems.

As a result, it was decided to use a conservative η factor, based on the NACA Report 898 ("A Unified Theory of Plastic Buckling of Columns and Plates", July 1947).

This factor is defined for all cases of loading (pure and combined) with the exception of shear load, by:

$$\eta_5 = \frac{E_{tan}}{E_c}$$

And for cases of pure shear load, by:

$$\eta_6 = \frac{(1+v_e)}{(1+v)} \cdot \frac{E_{sec}}{E_c}$$

The correction is calculated by using the equivalent elastic stress of Von Mises:

$$\sigma_{VM} = \sqrt{\sigma_{x\_comb}^{crit2} + \sigma_{y\_comb}^{crit2} - \sigma_{x\_comb}^{crit} \cdot \sigma_{y\_comb}^{crit} + 3 \cdot \tau_{xy\_comb}^{crit2}}$$

Therefore, the corrected stress capacities can be calculated:

$$\sigma_{x\_comb}^{plast} = \eta \cdot \sigma_{x\_comb}^{crit}$$

$$\sigma_{y\_comb}^{plast} = \eta \cdot \sigma_{y\_comb}^{crit}$$

$$\tau_{xy\_comb}^{plast} = \eta \cdot \tau_{xy\_comb}^{crit}$$

For cases of pure loading (compression according to X, compression according to Y or shear load), the plasticity correction is also applied to the Von Mises stress, therefore for cases of pure shear loading, the corrected stress is: $\sqrt{3} \cdot \tau_{xy}$.

5A.5 Isosceles Triangular Simply Supported Plates

Case of Pure Loading

Figure 26:
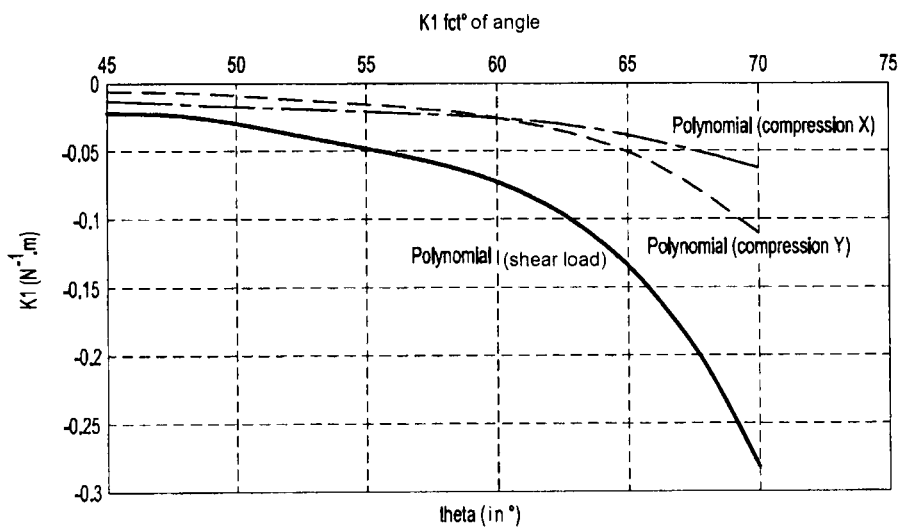
Figure 27:
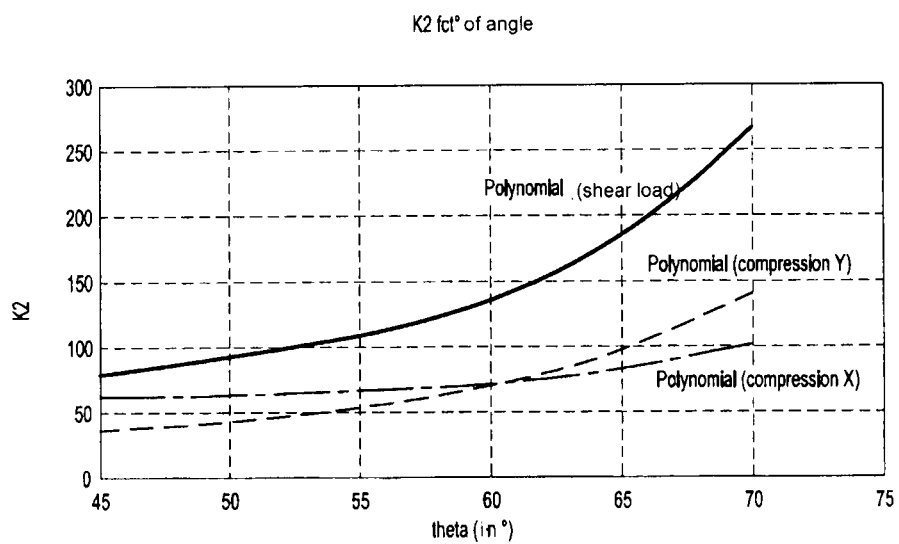

FIGS. 26 and 27 show the evolution of the $K_1$ and $K_2$ constants according to the isosceles triangle. The equations of these curves are (with θ in degrees):

$K_{1cX} = -0.0000002417 \cdot \theta^4 + 0.0000504863 \cdot \theta^3 - 0.0039782194 \cdot \theta^2 + 0.1393226958 \cdot \theta - 1.8379213492$ $K_{1cY} = -0.0000007200 \cdot \theta^4 + 0.0001511407 \cdot \theta^3 - 0.0119247778 \cdot \theta^2 + 0.4177844180 \cdot \theta - 5.4796530159$ $K_{1s} = -0.0000018083 \cdot \theta^4 + 0.0003804181 \cdot \theta^3 - 0.0300743972 \cdot \theta^2 + 1.0554840265 \cdot \theta - 13.8695053175$ $K_{2cX} = 0.0029565 \cdot \theta^3 - 0.4291321 \cdot \theta^2 + 21.1697836 \cdot \theta - 291.6730902$ $K_{2cY} = 0.0068664 \cdot \theta^3 - 1.0113413 \cdot \theta^2 + 51.3462358 \cdot \theta - 852.1945224$ $K_{2s} = 0.013637 \cdot \theta^3 - 2.017207 \cdot \theta^2 + 102.120039 \cdot \theta - 1674.287384$ Whether this is for $K_1$ or $K_2$, their values under pure compression X and pure Y are equal for an isosceles angle of 60°. The intersection point at 60° is proof of the isotropic behaviour of the structure stiffened by triangular pockets at 60°, in terms of local buckling in the skin.

Case of Combined Loading

In the case of combined loading, an analysis is carried out by finite element model of the linear calculation of buckling for simply supported triangular plates. We therefore choose a conservative interaction curve, close to the calculated interaction curves, but in a simple formula, which becomes the curve used in the method herein described. Its equation is: $R_1^A + R_2^B = 1$. With $$R_i = \frac{N_i^{app}}{N_i^{crit}},$$

i=cX, cY or s.

Interaction Compression X+Compression Y (Case 1)

In this case of loading, for angles between 45° and 70°, we chose a conservative interaction curve. That is to say a curve which declares an interaction to a value lower than the sum of compressions $R_{cX}$ on X and $R_{cY}$ on Y, in respect of all the interaction curves calculated for the angle values between 45° and 70°. This curve is defined by the following equation:

$R_{cX} + R_{cY} = 1$

Interaction Compression X+Shear Load (Case 2)

In this case of loading, for angles between 45° and 70°, we chose a conservative interaction curve, in respect of the different interaction curves according to angles between 45° and 70°, defined by the following equation:

$$R_{cX} + R_s^{\frac{3}{2}} = 1$$

Interaction Compression Y+Shear Load (Case 3)

For angles between 45° and 70°, in order to determine the reserve factor in the case of a combined compression loading according to Y and of shear load, we chose a conservative equation of the following formula: $R_{cY} + R_s^2 = 1$. In order to arrive at a single equation covering all cases of loading, we chose to use another, even more conservative curve $$R_{cY} + R_s^{\frac{3}{2}} = 1$$

Interaction Compression X+Compression Y+Shear Load (Case 4)

The equation chosen for these cases of loading is:

$$R_{cX} + R_{cY} + R_s^{\frac{3}{2}} = 1.$$

Figure 28:
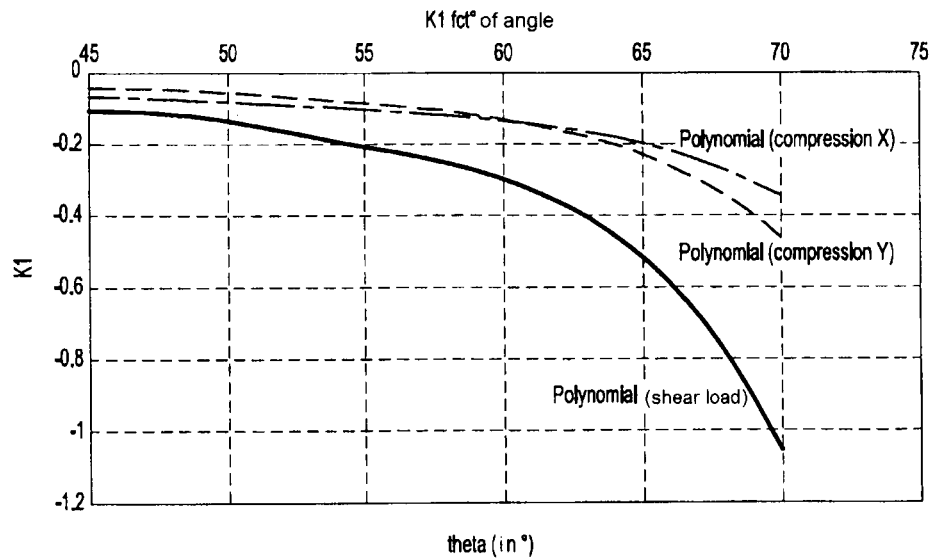
Figure 29:
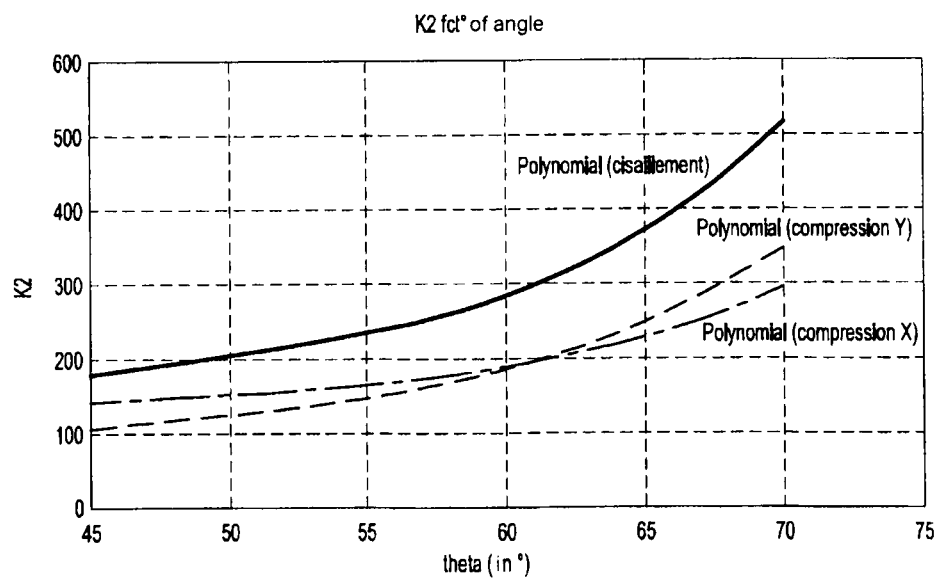

This unique equation is used for all cases of combined loading 5A.6 Clamped Isosceles Triangular Plates Case of Pure Loading FIGS. 28 and 29 show the evolution of the $K_1$ and $K_2$ constants according to the isosceles triangle. The equations of these curves are (with θ in degrees):

$K_{1cX} = -0.0000018547 \cdot \theta^4 + 0.0003940252 \cdot \theta^3 - 0.0314632778 \cdot \theta^2 + 1.1143937831 \cdot \theta - 14.8040153968$ $K_{1cY} = -0.0000027267 \cdot \theta^4 + 0.0005734489 \cdot \theta^3 - 0.0453489667 \cdot \theta^2 + 1.5921323016 \cdot \theta - 20.9299676191$ $K_{1s} = -0.0000069990 \cdot \theta^4 + 0.0014822211 \cdot \theta^3 - 0.1179080417 \cdot \theta^2 + 4.1617623127 \cdot \theta - 54.9899559524$ $K_{2cX} = 0.0110488 \cdot \theta^3 - 1.6258419 \cdot \theta^2 + 81.8278420 \cdot \theta - 1254.6580819$ $K_{2cY} = 0.0158563 \cdot \theta^3 - 2.3439723 \cdot \theta^2 + 119.5038876 \cdot \theta - 1970.9532998$ $K_{2s} = 0.0252562 \cdot \theta^3 - 3.7563673 \cdot \theta^2 + 191.0642156 \cdot \theta - 3113.4527806$ Case of Combined Loading In the case of combined loading, an analysis is carried out by finite element model of the linear calculation of buckling for clamped triangular plates. We therefore chose a conservative interaction curve, close to the calculated interaction curves, but in a simple formula, which becomes the curve used in the method herein described. Its equation is: $R_1^A + R_2^B = 1$, with $$R_i = \frac{N_i^{app}}{N_i^{crit}},$$

i=cX, cY or s.

Interaction Compression X+Compression Y (Case 1)

In this case of loading, for angles between 45° and 70°, we chose a conservative interaction curve, in respect of the different interaction curves according to angles between 45° and 70°, defined by the following equation: $R_{cX}+R_{cY}=1$ Interaction Compression X+Shear Load (Case 2)

In this case of loading, for angles between 45° and 70°, we chose a conservative interaction curve, in respect of the different interaction curves according to angles between 45° and 70°, defined by the following equation:

$$R_{cX} + R_s^{\frac{3}{2}} = 1$$

Interaction Compression Y+Shear Load (Case 3)

For angles of between 45° and 70°, to determine the reserve factor in the case of a combined compression load according to Y and of shear load, we chose a conservative equation of the following formula: $R_{cY}+R_s^2=1$. In order to arrive at a single equation covering all cases of loading, we chose to use another, even more conservative curve $$R_{cY} + R_s^{\frac{3}{2}} = 1$$

Interaction: Compression X+Compression Y+Shear Load (Case 4)

The equation, used for this case of loading, is $$R_{cX} + R_{cY} + R_s^{\frac{3}{2}} = 1.$$

This unique equation is used for all cases of combined loading.

5B Calculation of Local Buckling of the Stiffener:

This modulus calculates the buckling stress and the reserve factor of the stiffener web, considered as a rectangular panel with diverse boundary conditions to be defined by the user.

The applied stresses to take into account for the calculations of reserve factor are uniquely the stresses in the stiffener webs, derived from the modulus of calculation of applied stresses.

On the stiffener grid, one or several types of stiffener webs are compression loaded. Because of this the compression stress capacity must be calculated.

The entry data for this module are:
Geometric data: dimensions of stiffener webs (length, height, thickness),
Material data (linear (E,v) and non-linear ($F_{cy}$, $F_{tu}$, $\epsilon_{ult}$, $n_c$)). In the present example we are only considering an isotropic material,
boundary conditions (four are available),
Loads applied to the stiffener webs.

The exit data are the buckling capacity of the stiffener web and a reserve factor. The buckling stress capacity of the stiffener web is (see FIG. 13 for the notation conventions):

$$\sigma_{blade}^{crit} = k_c \cdot \frac{\eta \cdot E_c \cdot \pi^2}{12 \cdot (1 - v_e^2)} \cdot \left(\frac{b}{d}\right)^2 \quad \text{Equation 5-2}$$

With:
b: thickness of the stiffener web
d: height of the stiffener web
$L_b$: length of the stiffener web
$E_c$: Young's modulus in compression
$v_e$: Poisson coefficient in the elastic domain
$k_c$: Local buckling factor (dependent on boundary conditions and geometry)
$\eta$: Plasticity correction factor Note: the length of a stiffener web is given by $(L_b)=a$ (for stiffener webs in the X direction)

$$(L_b) = \frac{a}{2} \cdot \sqrt{1 + \tan^2 \theta}$$

(for stiffener webs in transversal directions)

Numerous boundary conditions can be applied on the stiffener web according to the surrounding structure. (see FIG. 14). We note that if Lb/d is greater than the value of Lim, then $k_c$ is worth $k_c$ infinitively. The recommended conservative buckling factor for calculations based on numerous finite element analyses case 2 (2 clamped edges—one simply supported edge—one free edge)

According to the boundary conditions cited above and according to table 1 of plastic correction factors for rectangular plates, the plasticity correction factor used in this case is:

$$\eta = \eta_1 = \frac{E_{sec}}{E_c} \cdot \frac{1 - v_e^2}{1 - v^2}$$

The formula for reserve factor calculation for buckling of the stiffener web is valid for all types of stiffener webs used in the present panel stiffened by triangular pockets (0°, +θ, −θ):

$$RF_{buck}^{blade} = \frac{\sigma_{blade}^{crit}}{\sigma_{blade}^{app}}$$

The following example is based on the same geometry as was used in the previous sections. The geometry of stiffeners is: b=2.5 mm, and d=37.36 mm. The length of stiffener webs is ($L_b$): $L_b$=a=198 mm for stiffener webs in the X direction and $L_b$=a/2·$\sqrt{1+\tan^2\theta}$=186.82 mm for transversal stiffener webs. The boundary conditions used are: 2 sides clamped—1 side simply supported—1 side free.

Thus:

$$k_{c\_0°} = 4.143 \cdot \left(\frac{d}{L_b}\right)^2 + 0.384 = 0.5315$$

for stiffener webs in the X direction and $$k_{c\_\theta°} = 4.143 \cdot \left(\frac{d}{L_b}\right)^2 + 0.384 = 0.5497$$

for transversal stiffener webs

And the buckling load for each stiffener is:

The plasticity correction factor at stiffener web buckling is:

$$\eta = \eta_1 = \frac{E_{sec}}{E_c} \cdot \frac{1 - v_e^2}{1 - v^2} = 1 \text{ (elastic)}$$

The loads applied in the stiffeners are:

$\sigma_{0°} = -101.14$ MPa $\sigma_{+\theta} = 44.25$ MPa $\sigma_{-\theta} = -135.07$ MPa The results of reserve facture calculation are the following:

Step 6—Calculation of General Instability:

This step provides data on buckling flow capacity for a flat panel stiffened by triangular pockets, in the conditions of pure or combined loading.

The formulae are based on the buckling of orthotropic plates. Two or four boundary conditions are possible according to the loading case (4 simply-supported edges, 4 clamped edges, 2 loaded simply supported edges and 2 lateral clamped edges, 2 loaded clamped edges and 2 simply supported lateral edges). The applied flows, to take into account for reserve factor calculation, are the external flows of the panel stiffened by triangular pockets which are the entry data.

The entry data are the following:

Geometric data:

$L_x$: length of the panel equivalent to the grid $L_y$: width of the panel equivalent to the grid, $t_s$: thickness of the skin, $t_g$: thickness of the panel equivalent to the grid, Data on the material:

$E_x^s$, $E_y^s$: Young's modulus of the skin, $G_{xy}^s$: shear modulus of the skin, $v_{xy}^s$, $v_{yx}^s$: Poisson coefficient of the skin, $E_x^g$, $E_y^g$: Young's modulus of the grid, $G_{xy}^g$: shear modulus of the grid, $v_{xy}^g$, $v_{yx}^g$: Poisson coefficient of the grid, loads applied to the structure ($N_x^0$, $N_y^0$, $N_{xy}^0$, $p_z$)

boundary conditions (2 or 4 are possible according to the type of loading)

The exit data are:

$N_x^c$, $N_y^c$, $N_{xy}^c$: buckling flow capacity, $N_{x\,comb}^c$, $N_{y\,comb}^c$, $N_{xy\,comb}^c$: combined buckling flow capacity, Reserve factors We use the Kirchhoff hypothesis: plane sections remain principally plane following strain. The grid (of stiffeners) is modelled here by an equivalent panel. The skin and the panel equivalent to the grid are considered as plates of an orthotropic nature.

The material parameters verify the following relation:

$$\frac{v_{xy}^i}{E_x^i} = \frac{v_{yx}^i}{E_y^i}$$

The conventions of flow and moments are illustrated by FIG. 21.

6.1.1 Displacements

The vector $\vec{U}$ represents the displacement of a point M(x,y) of the median surface: $\vec{U}=[u, v, w]=u(x,y)\vec{x}+v(x,y)\vec{y}+w(x,y)\vec{z}$ The different variables do not depend on z because a plane state of stresses has been envisaged ($\tau_{zz}=0$).

6.1.2 Strains

The general expression of strains in a section of the plate situated at a z distance from the median axis is:

$$\begin{cases} \varepsilon_{xx} = \varepsilon_{xx}^0 + z\cdot\kappa_{xx} \\ \varepsilon_{yy} = \varepsilon_{yy}^0 + z\cdot\kappa_{yy} \\ \varepsilon_{xy} = \varepsilon_{xy}^0 + z\cdot\kappa_{xy} \end{cases} \quad \text{Equation 6-1}$$

With:

$$\begin{cases} \varepsilon_{xx}^0 = u_{,x} + \frac{1}{2}(w_{,x})^2 \\ \varepsilon_{yy}^0 = v_{,y} + \frac{w}{R} + \frac{1}{2}(w_{,y})^2 \\ \varepsilon_{xy}^0 = \frac{1}{2}(u_{,y} + v_{,x}) + \frac{1}{2}w_{,x}\cdot w_{,y} \end{cases} \quad \text{Equation 6-2}$$

The terms $\epsilon_{xx}^0$, $\epsilon_{yy}^0$, and $\epsilon_{xy}^0$ represent the contribution in strain in the plane of the plate. The terms $$\frac{1}{2}(w_{,x})^2, \frac{1}{2}(w_{,y})^2 \text{ and } \frac{1}{2}w_{,x}\cdot w_{,y}$$

represent the non-linear contribution in strain in the plane of the plate. The term R represents the radius of the shell, but here we are considering a plane plate, therefore, $$\frac{1}{R} = 0.$$

$$\begin{cases} \kappa_{xx} = -w_{,x2} \\ \kappa_{yy} = -w_{,y2} \\ \kappa_{xy} = -w_{,xy} \end{cases} \quad \text{Equation 6-3}$$

The terms $z\cdot\kappa_{xx}$, $z\cdot\kappa_{yy}$ and $z\cdot\kappa_{xy}$ represent the contribution in strain due to the change of the plate curve (z is the distance from the median axis of the plate).

6.1.3 Behaviour Laws

The sink and the panel equivalent to the stiffeners are considered as orthotropic plates. Because of this the relations between stresses and strains are:

$$\begin{pmatrix} \sigma_{xx}^i \\ \sigma_{yy}^i \\ \sigma_{xy}^i \end{pmatrix} = \begin{pmatrix} \frac{E_x^i}{1-v_{xy}^i v_{yx}^i} & \frac{v_{xy}^i E_y^i}{1-v_{xy}^i v_{yx}^i} & 0 \\ \frac{v_{yx}^i E_x^i}{1-v_{xy}^i v_{yx}^i} & \frac{E_y^i}{1-v_{xy}^i v_{yx}^i} & 0 \\ 0 & 0 & 2G_{xy}^i \end{pmatrix} \begin{pmatrix} \varepsilon_{xx} \\ \varepsilon_{yy} \\ \varepsilon_{xy} \end{pmatrix} \quad \text{Equation 6-4}$$

with i=(s, g) (indices s for the values relative to the skin and indices g for the values relative to the stiffener grid).

6.1.4 Flow and Moments

The expressions of flow and moments by unit of length are:

$$N_{\alpha\beta} = \int_h \sigma_{\alpha\beta} dz \qquad \text{Equation 6-5}$$

$$M_{\alpha\beta} = \int_h \sigma_{\alpha\beta} \cdot z \, dz$$

with $(\alpha,\beta)=(x,y)$.

Flow:

$$N_{\alpha\beta} = \int_h \sigma_{\alpha\beta} dz = \int_{-\frac{h}{2}}^{-\frac{h}{2}+t_s} \sigma_{\alpha\beta}^s dz + \int_{-\frac{h}{2}+t_s}^{\frac{h}{2}} \sigma_{\alpha\beta}^g dz$$

By using Equation 6-5 and the relation $h=t_s+t_g$ we find:

$$N_{xx} = \qquad \text{Equation 6-6}$$

$$\left(\frac{E_x^s t_s}{1-\nu_{xy}^s \nu_{yx}^s} + \frac{E_x^g t_g}{1-\nu_{xy}^g \nu_{yx}^g}\right)\varepsilon_{xx}^0 + \left(\frac{\nu_{xy}^s E_y^s t_s}{1-\nu_{xy}^s \nu_{yx}^s} + \frac{\nu_{xy}^g E_y^g t_g}{1-\nu_{xy}^g \nu_{yx}^g}\right)$$

$$\varepsilon_{yy}^0 + \left[\frac{1}{2}t_s t_g\left(\frac{E_x^g}{1-\nu_{xy}^g \nu_{yx}^g} - \frac{E_x^s}{1-\nu_{xy}^s \nu_{yx}^s}\right)\right]$$

$$\kappa_{xx} + \left[\frac{1}{2}t_s t_g\left(\frac{\nu_{xy}^g E_y^g}{1-\nu_{xy}^g \nu_{yx}^g} - \frac{\nu_{xy}^s E_y^s}{1-\nu_{xy}^s \nu_{yx}^s}\right)\right]\kappa_{yy}$$

$$N_{yy} = \left(\frac{\nu_{yx}^s E_x^s t_s}{1-\nu_{xy}^s \nu_{yx}^s} + \frac{\nu_{yx}^g E_x^g t_g}{1-\nu_{xy}^g \nu_{yx}^g}\right)\varepsilon_{xx}^0 +$$

$$\left(\frac{E_y^s t_s}{1-\nu_{xy}^s \nu_{yx}^s} + \frac{E_y^g t_g}{1-\nu_{xy}^g \nu_{yx}^g}\right)\varepsilon_{yy}^0 +$$

$$\left[\frac{1}{2}t_s t_g\left(\frac{\nu_{yx}^g E_x^g}{1-\nu_{xy}^g \nu_{yx}^g} - \frac{\nu_{yx}^s E_x^s}{1-\nu_{xy}^s \nu_{yx}^s}\right)\right]\kappa_{xx} +$$

$$\left[\frac{1}{2}t_s t_g\left(\frac{E_y^g}{1-\nu_{xy}^g \nu_{yx}^g} - \frac{E_y^s}{1-\nu_{xy}^s \nu_{yx}^s}\right)\right]\kappa_{yy}$$

$$N_{xy} = 2(G_{xy}^s t_s + G_{xy}^g t_g)\varepsilon_{xy}^0 + [t_s t_g(G_{xy}^g - G_{xy}^s)]\kappa_{xy}$$

Moments by unit of length:

$$M_{\alpha\beta} = \int_h \sigma_{\alpha\beta} z \, dz = \int_{-\frac{h}{2}}^{-\frac{h}{2}+t_s} \sigma_{\alpha\beta}^s z \, dz + \int_{-\frac{h}{2}+t_s}^{\frac{h}{2}} \sigma_{\alpha\beta}^g z \, dz$$

By using Equation 6-5 and the relation $h=t_s+t_g$ we find:

$$-M_{xx} = \left[\frac{1}{2}t_s t_g\left(\frac{E_x^g}{1-\nu_{xy}^g \nu_{yx}^g} - \frac{E_x^s}{1-\nu_{xy}^s \nu_{yx}^s}\right)\right] \qquad \text{Equation 6-7}$$

$$\varepsilon_{xx}^0 + \left[\frac{1}{2}t_s t_g\left(\frac{\nu_{xy}^g E_y^g}{1-\nu_{xy}^g \nu_{yx}^g} - \frac{\nu_{xy}^s E_y^s}{1-\nu_{xy}^s \nu_{yx}^s}\right)\right]\varepsilon_{yy}^0 +$$

$$\left[\frac{1}{12}\left(\frac{E_x^s t_s(t_s^2 + 3t_g^2)}{1-\nu_{xy}^s \nu_{yx}^s} + \frac{E_x^g t_g(t_g^2 + 3t_s^2)}{1-\nu_{xy}^g \nu_{yx}^g}\right)\right]\kappa_{xx} +$$

$$\left[\frac{1}{12}\left(\frac{\nu_{xy}^s E_y^s t_s(t_s^2 + 3t_g^2)}{1-\nu_{xy}^s \nu_{yx}^s} + \frac{\nu_{xy}^g E_y^g t_g(t_g^2 + 3t_s^2)}{1-\nu_{xy}^g \nu_{yx}^g}\right)\right]\kappa_{yy}$$

$$M_{yy} = \left[\frac{1}{2}t_s t_g\left(\frac{\nu_{yx}^g E_x^g}{1-\nu_{xy}^g \nu_{yx}^g} - \frac{\nu_{yx}^s E_x^s}{1-\nu_{xy}^s \nu_{yx}^s}\right)\right]\varepsilon_{xx}^0 +$$

$$\left[\frac{1}{2}t_s t_g\left(\frac{E_y^g}{1-\nu_{xy}^g \nu_{yx}^g} - \frac{E_y^s}{1-\nu_{xy}^s \nu_{yx}^s}\right)\right]$$

-continued $$\varepsilon_{yy}^0 + \left[\frac{1}{12}\left(\frac{\nu_{yx}^s E_x^s t_s(t_s^2 + 3t_g^2)}{1-\nu_{xy}^s \nu_{yx}^s} + \frac{\nu_{yx}^g E_x^g t_g(t_g^2 + 3t_s^2)}{1-\nu_{xy}^g \nu_{yx}^g}\right)\right]\kappa_{xx} +$$

$$\left[\frac{1}{12}\left(\frac{E_y^s t_s(t_s^2 + 3t_g^2)}{1-\nu_{xy}^s \nu_{yx}^s} + \frac{E_y^g t_g(t_g^2 + 3t_s^2)}{1-\nu_{xy}^g \nu_{yx}^g}\right)\right]\kappa_{yy} -$$

$$M_{xy} = [t_s t_g(G_{xy}^g - G_{xy}^s)]\varepsilon_{xy}^0 + \left[\frac{1}{6}(G_{xy}^s t_s(t_s^2 + 3t_g^2) + G_{xy}^g t_g(t_g^2 + 3t_s^2))\right]\kappa_{xy}$$

Once the general behaviour law (between flow and moments on one hand and strains on the other), is obtained:

$$\begin{pmatrix} N_{xx} \\ N_{yy} \\ N_{xy} \\ -M_{xx} \\ M_{yy} \\ -M_{xy} \end{pmatrix} = \left(\begin{array}{c|c} \overline{\overline{A}} & \overline{\overline{B}} \\ \hline \overline{\overline{B}} & \overline{\overline{C}} \end{array}\right) \cdot \begin{pmatrix} \varepsilon_{xx}^0 \\ \varepsilon_{yy}^0 \\ \varepsilon_{xy}^0 \\ \kappa_{xx} \\ \kappa_{yy} \\ \kappa_{xy} \end{pmatrix} = \qquad \text{Equation 6-8}$$

$$\begin{pmatrix} A_{11} & A_{12} & 0 & B_{11} & B_{12} & 0 \\ A_{12} & A_{22} & 0 & B_{12} & B_{22} & 0 \\ 0 & 0 & A_{11} & 0 & 0 & B_{33} \\ B_{11} & B_{12} & 0 & C_{11} & C_{12} & 0 \\ B_{12} & B_{11} & 0 & C_{12} & C_{22} & 0 \\ 0 & 0 & B_{33} & 0 & 0 & C_{33} \end{pmatrix} \cdot \begin{pmatrix} \varepsilon_{xx}^0 \\ \varepsilon_{yy}^0 \\ \varepsilon_{xy}^0 \\ \kappa_{xx} \\ \kappa_{yy} \\ \kappa_{xy} \end{pmatrix}$$

Matrices A, B and C are symmetrical.

6.2 Balance Equations

General balance equations of an element of the panel (or shell) are given by the following expressions, linking flows, moments and surface strength density:

$$\begin{cases} N_{xx,x} + N_{xy,y} + p_x = 0 \\ N_{yy,y} + N_{yx,x} + p_y = 0 \\ (N_{xx} w_{,x})_{,x} + (N_{yy} w_{,y})_{,y} + (N_{xy} w_{,y})_{,x} + (N_{yx} w_{,x})_{,y} - \\ \frac{N_{yy}}{R} - M_{xx,x^2} + M_{yy,y^2} - 2M_{xy,xy} + p_z = 0 \end{cases} \qquad \text{Equation 6-9}$$

where $\vec{f} = p_x \vec{x} + p_y \vec{y} + p_z \vec{z}$ is the surface strength density acting on the shell element. The surface strength density only acts along the Z radial direction, and not in the other directions. Therefore, $p_x = p_y = 0$. Furthermore, in this instance we are considering the case of a flat plate, therefore $$\frac{1}{R} = 0.$$

Because of this we obtain simplified balance equations:

$$\begin{cases} N_{xx,x} + N_{xy,y} = 0 \\ N_{yy,y} + N_{yx,x} = 0 \\ N_{xx}w_{,x^2} + N_{yy}w_{,y^2} + 2N_{xy}w_{,xy} + \\ p_z = M_{xx,x^2} - M_{yy,y^2} + 2M_{xy,xy} \end{cases}$$ Equation 6-10

6.3 For the general solution of these equations, we define the following vectors $$[\varepsilon] = \begin{bmatrix} \varepsilon_{xx} \\ \varepsilon_{yy} \\ \varepsilon_{xy} \end{bmatrix}$$ Equation 6-11

$$[N] = \begin{bmatrix} N_{xx} \\ N_{yy} \\ N_{xy} \end{bmatrix}$$

$$[K] = \begin{bmatrix} \kappa_{xx} \\ \kappa_{yy} \\ \kappa_{xy} \end{bmatrix}$$

$$[W] = \begin{bmatrix} w_{,xx} \\ w_{,yy} \\ w_{,xy} \end{bmatrix}$$

$$[M] = \begin{bmatrix} -M_{xx} \\ M_{yy} \\ -M_{xy} \end{bmatrix}$$

The usual loads applied on the plate are:
Uniform compression flow along the x axis: $-N_x^0$
Uniform compression flow along the y axis: $-N_y^0$
Uniform shear flow in the x-y plane: $-N_{xy}^0$
Uniform Pressure along the z axis: $p_z \vec{z}$ Because of this, since the applied loads defined below are uniform, it can be deduced that the two first equations of Equation 6-10 are verified. $N_{xx,x}=N_{yy,y}=N_{xy,y}=N_{yx,x}=0$.

Expression of Moments:
By using Equation 6-8 and Equation 6-11, the following relations are found:

$[N]=\overline{A}\cdot[\varepsilon]+\overline{B}\cdot[K]$ $[M]=\overline{B}\cdot[\varepsilon]+\overline{C}\cdot[K]$ Equation 6-12

As the applied flows are uniform, the following relations are obtained:

$[N]_{,x^2}=0 \Leftrightarrow \overline{A}\cdot[\varepsilon]_{,x^2}+\overline{B}\cdot[K]_{,x^2}=0 \Leftrightarrow [\varepsilon]_{,x^2}=\overline{A}^{-1}\cdot\overline{B}\cdot[W]_{,x^2}$ $[N]_{,y^2}=0 \Leftrightarrow \overline{A}\cdot[\varepsilon]_{,y^2}+\overline{B}\cdot[K]_{,y^2}=0 \Leftrightarrow [\varepsilon]_{,y^2}=\overline{A}^{-1}\cdot\overline{B}\cdot[W]_{,y^2}$ $[N]_{,xy}=0 \Leftrightarrow \overline{A}\cdot[\varepsilon]_{,xy}+\overline{B}\cdot[K]_{,xy}=0 \Leftrightarrow [\varepsilon]_{,xy}=\overline{A}^{-1}\cdot\overline{B}\cdot[W]_{,xy}$ Equation 6-13

With the fact that: $[W]=-[K]$.
We therefore have for moments:

$[M]_{,x^2}=\overline{B}\cdot[\varepsilon]_{,x^2}+\overline{C}\cdot[K]_{,x^2}=(\overline{B}\cdot\overline{A}^{-1}\overline{B}-\overline{C})\cdot[W]_{,x^1}=-\overline{D}\cdot[W]_{,x^2}$ $[M]_{,y^2}=\overline{B}\cdot[\varepsilon]_{,y^2}+\overline{C}\cdot[K]_{,y^2}=(\overline{B}\cdot\overline{A}^{-1}\overline{B}-\overline{C})\cdot[W]_{,y^1}=-\overline{D}\cdot[W]_{,y^2}$ $[M]_{,xy}=\overline{B}\cdot[\varepsilon]_{,xy}+\overline{C}\cdot[K]_{,xy}=(\overline{B}\cdot\overline{A}^{-1}\overline{B}-\overline{C})\cdot[W]_{,xy}=-\overline{D}\cdot[W]_{,xy}$ Equation 6-14 with $\overline{D}=\overline{C}-\overline{B}\cdot\overline{A}^{-1}\cdot\overline{B}$ Equation 6-15

D is the global stiffness matrix, and is symmetrical.

$$\overline{D} = \begin{pmatrix} D_{11} & D_{12} & 0 \\ D_{12} & D_{22} & 0 \\ 0 & 0 & D_{33} \end{pmatrix}$$

Derivations of the moments of the Equation 6-10 are therefore obtained:

$M_{xx,x^2}=D_{11}w_{,x^4}+D_{12}w_{,x^2y^2}$ $-M_{yy,y^2}=D_{12}w_{,x^2y^2}+D_{22}w_{,y^4}$ $M_{xy,xy}=D_{33}w_{,x^2y^2}$ Equation 6-16

The expression of Equation 6-10 in terms of displacements therefore gives the general differential equation:

$-N_x^0 w_{,x^2} - N_y^0 w_{,y^2} - 2N_{xy}^0 w_{,xy} + p_z = \Omega_1 w_{,x^4} + \Omega_2 w_{,y^4} + \Omega_3 w_{,x^2y^2}$ Equation 6-17 with:

$\Omega_1 = D_{11}$ $\Omega_2 = D_{22}$ $\Omega_3 = 2\cdot(D_{12}+D_{33})$ Equation 6-18

In the following section, the panel stiffened by triangular pockets is modelled with its three bending stiffeners ($\Omega 1$, $\Omega 2$ and $\Omega 3$) in order to calculate the buckling flows in an orthotropic plate.

Here again, the following hypothesis is used in this case: if some components of the combined load are in tension, these components are not taken into account for the calculation. It is, in effect, conservative to consider that the components in tension have no affect with regards to the buckling flow being studied, and do not improve the buckling stress on the plate.

6.4 Buckling Flow Capacity
6.4.1 Longitudinal Compression Flow (Compression According to X)

The plate is subjected to a uniform longitudinal compression flow (according to the X axis): $-N_x^0$. Because of this: $N_y^0=N_{xy}^0=p_z=0$. The general differential equation (Equation 6-17) therefore expresses:

$-N_x^0 w_{,x^2} = \Omega_1 w_{,x^4} + \Omega_2 w_{,y^4} + \Omega_3 w_{,x^2y^2}$ Equation 6-19

Firstly, we consider a simply supported plate (the boundary conditions are generalised further on):
For x=0 and x=$L_x$: w=0 and $-M_{xx}=0$
For y=0 and y=$L_y$: w=0 and $M_{yy}=0$
The following expression for displacement w satisfies all the boundary conditions detailed above:

$$w(x, y) = C_{mn}\sin\left(\frac{m\pi x}{L_x}\right)\sin\left(\frac{n\pi y}{L_y}\right) \quad (m, n) \in N^2$$ Equation 6-20

The previous expression for w must satisfy the general differential equation (Equation 6-19), therefore we obtain:

$$N_x^0 \left(\frac{m\pi}{L_x}\right)^2 = \Omega_1 \left(\frac{m\pi}{L_x}\right)^4 + \Omega_2 \left(\frac{n\pi}{L_y}\right)^4 + \Omega_3 \left(\frac{m\pi}{L_x}\right)^2 \left(\frac{n\pi}{L_y}\right)^2 \ (m, n) \in N^2$$

The minimum value of $N_x^0$ corresponds to the value of flow capacity of general buckling $N_x^c$. We demonstrate that this value is:

$$N_x^c = 2 \left(\frac{\pi}{L_y}\right)^2 \left(\sqrt{\Omega_1 \Omega_2} + \frac{\Omega_3}{2}\right) \quad \text{Equation 6-21}$$

This formula can be generalised for different boundary conditions (loaded edges and simply supported or clamped lateral edges):

$$N_x^c = k_c \left(\frac{\pi}{L_y}\right)^2 \sqrt{\Omega_1 \Omega_2} \quad \text{Equation 6-22}$$

with $$k_c = h(\overline{\alpha}) + q \cdot \beta$$

$$\overline{\alpha} = \frac{L_x}{L_y} \sqrt[4]{\frac{\Omega_2}{\Omega_1}}$$

$$\beta = \frac{\Omega_3}{2\sqrt{\Omega_1 \Omega_2}}$$

$$h(\overline{\alpha}) = \begin{cases} \left(\frac{1}{\overline{\alpha}}\right)^2 + \overline{\alpha}^2, & \text{si } \overline{\alpha} \leq 1 \\ 2, & \text{sin on} \end{cases}$$

$$q = 2$$

Figure 22:
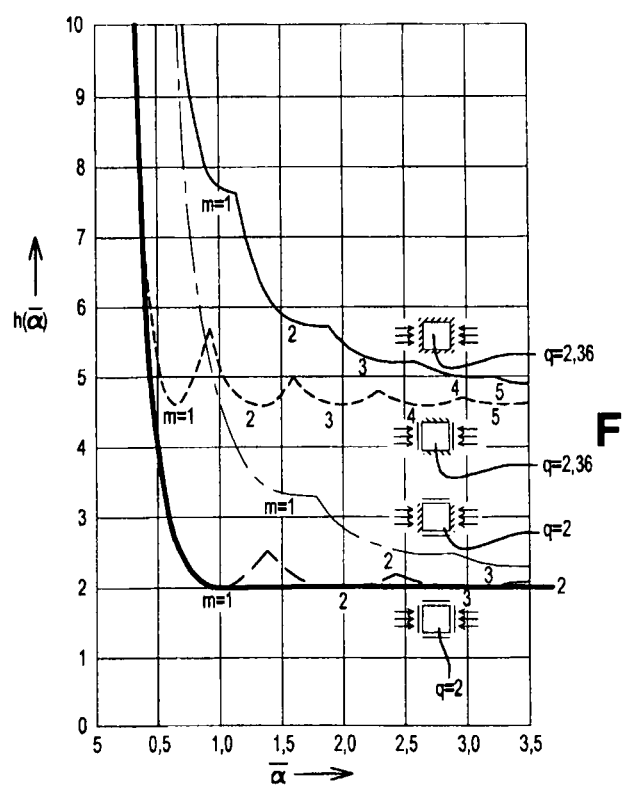

FIG. 22 shows the value of $h(\overline{\alpha})$ according to different boundary conditions (the case of four simply supported edges is the base curve).

6.4.2 Transversal Compression Flow (Compression According to Y)

The plate is subjected to a uniform transversal compression flow (according to the Y axis): $-N_y^0$. Because of this: $N_x^0 = N_{xy}^0 = p_z = 0$. The solution is the same as the one described in the previous section.

The buckling capacity flow $N_y^c$ is expressed by:

$$N_y^c = k_c \left(\frac{\pi}{L_x}\right)^2 \sqrt{\Omega_2 \Omega_1} \quad \text{Equation 6-23}$$

with $$k_c = h(\overline{\alpha}) + q \cdot \beta$$

$$\overline{\alpha} = \frac{L_y}{L_x} \sqrt[4]{\frac{\Omega_1}{\Omega_2}}$$

$$\beta = \frac{\Omega_3}{2\sqrt{\Omega_2 \Omega_1}}$$

$$h(\overline{\alpha}) = \begin{cases} \left(\frac{1}{\overline{\alpha}}\right)^2 + \overline{\alpha}^2, & \text{si } \overline{\alpha} \leq 1 \\ 2, & \text{sin on} \end{cases}$$

$$q = 2$$

6.4.3 Shear Flow

The plate is subjected to a uniform shear flow: $-N_{xy}^0$. Because of this: $N_x^0 = N_y^0 = p_z = 0$. We note that in this para-graph, the following formulae are only validated for Ly<Lx. In the opposite case, some terms must be exchanged: $L_x \leftrightarrow L_y$, and $\Omega_1 \leftrightarrow \Omega_2$. The buckling flow capacity $N_{xy}^c$ is expressed by:

$$N_{xy}^c = k_s \left(\frac{\pi}{L_y}\right)^2 \sqrt[4]{\Omega_1 \Omega_2^3} \quad \text{Equation 6-24}$$

Figure 23:
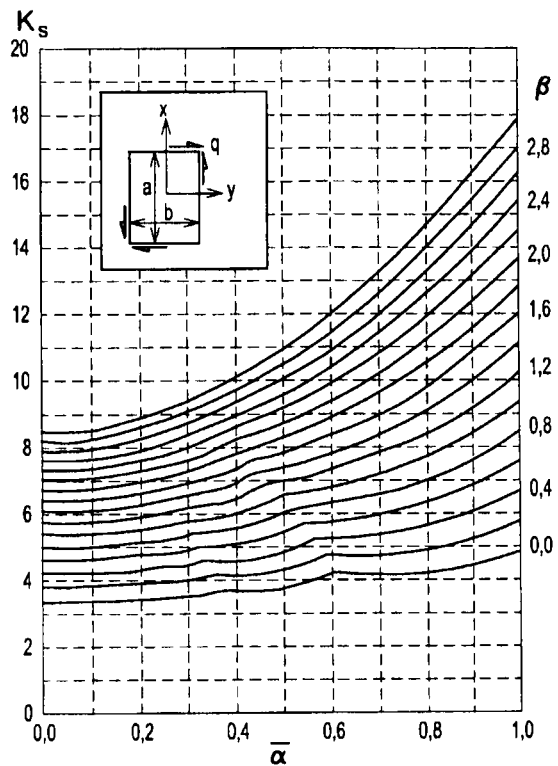
Figure 25:
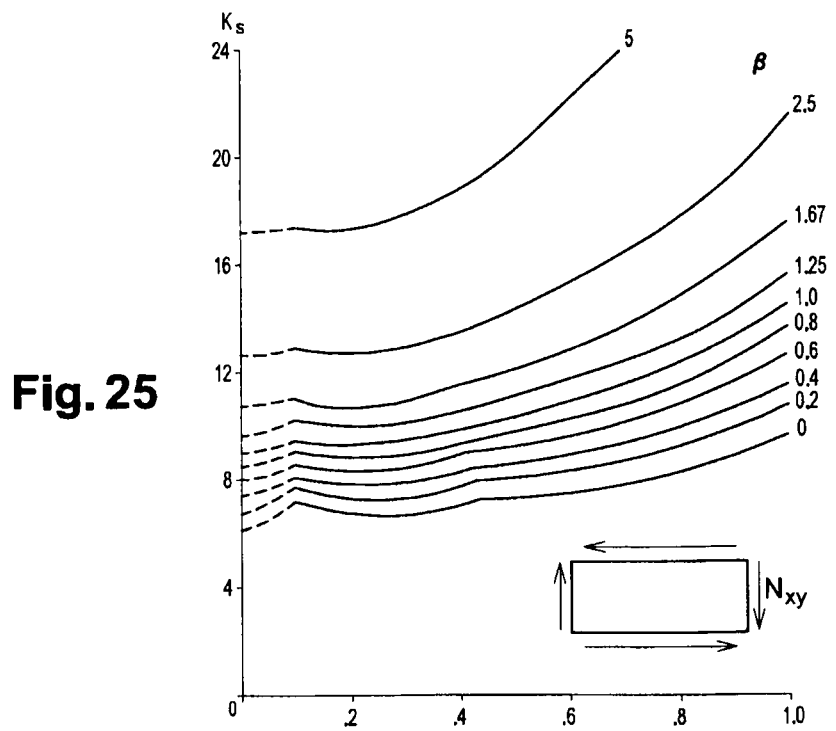

With $k_s$ obtained from the graph in FIG. 23 and the table in FIG. 24 (for the case of simply supported edges), and in FIG. 25 (case of four clamped edges) (source: S. G. Lekhnitskii: Anisotropic Plates. Gordon and Breach).

The entry data of the table and the graph are defined with:

$$\overline{\alpha} = \frac{L_y}{L_x} \sqrt[4]{\frac{\Omega_1}{\Omega_2}}$$

$$\beta = \frac{\Omega_3}{2\sqrt{\Omega_2 \Omega_1}}$$

6.4.4 Biaxial Compression Flow

The plate is subjected to combined loading: a uniform longitudinal compression flow (according to the x axis) and a uniform transversal compression flow (according to the y axis): $-N_{x_{comb}}^0$ and $-N_{y_{comb}}^0$. Because of this: $N_{xy}^0 = p_z = 0$. We define λ by: $N_{y_{comb}}^0 = \lambda N_{x_{comb}}^0$. The general differential equation is expressed $$-N_{x_{comb}}^0 w_{,x^2} - N_{y_{comb}}^0 w_{,y^2} = \Omega_1 w_{,x^4} + \Omega_2 w_{,y^4} + \Omega_3 w_{,x^2 y^2} \quad \text{Equation 6-25}$$

Boundary Conditions Four Simply Supported Edges:

For x=0 and x=$L_x$: w=0 and $-M_{xx}=0$

For y=0 and y=$L_y$, W=0 and $M_{yy}=0$

Expression of Displacement:

The following expression of displacement w satisfies all the boundary conditions detailed above:

$$w(x, y) = C_{mn} \sin\left(\frac{m\pi x}{L_x}\right) \sin\left(\frac{n\pi y}{L_y}\right) (m, n) \in N^2 \quad \text{Equation 6-26}$$

Buckling Flow Capacity $N_{x_{comb}}^c$, $N_{y_{comb}}^c$):

The previous expression for w must satisfy the general differential equation (Equation 6-25), and we therefore obtain:

$$N_{x_{comb}}^0 \left(\frac{m\pi}{L_x}\right)^2 + N_{y_{comb}}^0 \left(\frac{n\pi}{L_y}\right)^2 =$$

$$\Omega_1 \left(\frac{m\pi}{L_x}\right)^4 + \Omega_2 \left(\frac{n\pi}{L_y}\right)^4 + \Omega_3 \left(\frac{m\pi}{L_x}\right)^2 \left(\frac{n\pi}{L_y}\right)^2 (m, n) \in N^2$$

The expression of $N_{x_{comb}}^0$ according to λ must satisfy:

$$N_{x_{comb}}^0 =$$

$$\frac{\pi^2}{L_y^2 m^2 + \lambda L_x^2 n^2} \left[\Omega_1 \left(\frac{L_y}{L_x}\right)^2 m^4 + \Omega_2 \left(\frac{L_x}{L_y}\right)^2 n^4 + \Omega_3 m^2 n^2\right] (m, n) \in N^2$$

thus, the buckling flow capacities are obtained:

$$N^c_{xcomb} = \text{Min}\left\{\frac{\pi^2}{L_y^2 m^2 + \lambda L_x^2 n^2}\left[\Omega_1\left(\frac{L_y}{L_x}\right)^2 m^4 + \Omega_2\left(\frac{L_x}{L_y}\right)^2 n^4 + \Omega_3 m^2 n^2\right], (m,n) \in N^2\right\}$$

Equation 6-1

$$N^c_{ycomb} = \lambda N^c_{xcomb}$$

Boundary Conditions: Four Clamped Edges:
For x=0 and x=$L_x$:

$$w = 0 \text{ and } \frac{\partial w}{\partial y} = 0$$

For y=0 and y=$L_y$:

$$w = 0 \text{ and } \frac{\partial w}{\partial x} = 0$$

Expression of Displacement:
The following expression of displacement w satisfies all the boundary conditions detailed above:

$$w(x,y) = C_{mn}\left[1 - \cos\left(\frac{m \cdot 2 \cdot \pi \cdot x}{L_x}\right)\right]\left[1 - \cos\left(\frac{n \cdot 2 \cdot \pi \cdot y}{L_y}\right)\right] \quad (m,n) \in N^2$$

Equation 6-28

Buckling Flow Capacity ($N^c_{xcomb}$, $N^c_{ycomb}$):
The expression of $N^0_{xcomb}$ according to $\lambda$ must satisfy:

$$N^0_{xcomb} = \frac{4\pi^2}{L_y^2 m^2 + \lambda L_x^2 n^2}\left[\Omega_1\left(\frac{L_y}{L_x}\right)^2 m^4 + \Omega_2\left(\frac{L_x}{L_y}\right)^2 n^4 + \frac{1}{3}\Omega_3 m^2 n^2\right] \quad (m,n) \in N^2$$

thus, the buckling flow capacities are obtained:

$$N^c_{xcomb} = \text{Min}\left\{\frac{4\pi^2}{L_y^2 m^2 + \lambda L_x^2 n^2}\left[\Omega_1\left(\frac{L_y}{L_x}\right)^2 m^4 + \Omega_2\left(\frac{L_x}{L_y}\right)^2 n^4 + \frac{1}{3}\Omega_3 m^2 n^2\right], (m,n) \in N^2\right\}$$

Equation 6-2

$$N^c_{ycomb} = \lambda N^c_{xcomb}$$

6.4.5 Longitudinal and Shear Compression Flow

The plate is subjected to combined loading: uniform longitudinal (according to the axis X) and shear compression flow: $-N^0_{x_{comb}}$ and $-N^0_{xy_{comb}}$.
Because of this: $N_y^0 = p_z = 0$.
Interaction Equation:
The interaction equation for the combined flows of longitudinal and shear compression is:

$$R_x + R_{xy}^{1.75} = 1$$

Equation 6-30

With $$R_x = \frac{N^c_{x_{comb}}}{N^c_x}$$

ratio of longitudinal compression flow $$R_{xy} = \frac{N^c_{xy_{comb}}}{N^c_{xy}}$$

ratio of shear flow
where $N_x^c$ and $N_{xy}^c$ are the buckling flow capacities calculated above for a uniaxial loading.

6.4.6 Transversal and Shear Compression Flow

The plate is subjected to a uniform transversal compression flow (according to the y axis) and a shear flow: $-N^0_{y_{comb}}$ and $-N^0_{xy_{comb}}$.
Because of this: $N_x^0 = p_z = 0$.
The interaction equation for the combined flows of transversal and shear compression is:

$$R_y + R_{xy}^{1.75} = 1$$

Equation 6-31

With:

$$R_y = \frac{N^c_{y_{comb}}}{N^c_y}$$

ratio of transversal compression flow $$R_{xy} = \frac{N^c_{xy_{comb}}}{N^c_{xy}}$$

ratio of shear flow
where $N_y^c$ and $N_{xy}^c$ are the buckling capacity flows calculated above for a uniaxial loading.

6.4.7 Biaxial and Shear Compression Flow

The plate is subjected to combined loadings: a uniform longitudinal compression flow (according to the x axis) and a uniform transversal compression flow (according to the y axis) as well as a buckling flow: $-N^0_{x_{comb}}$, $-N^0_{y_{comb}}$ and $-N^0_{xy_{comb}}$.
Because of this: $p_z = 0$.
The interaction equation is obtained in two steps. Firstly, we determine a reserve factor $RF_{bi}$ corresponding to the biaxial compression flow:

$$RF_{bi} = \frac{N^c_{x_{comb}}}{N^0_{x_{comb}}} = \frac{N^c_{y_{comb}}}{N^0_{y_{comb}}}$$

Equation 6-32

Then this value is used in an interaction equation for the combined flows of biaxial and shear compression:

$$R_{bi} + R_{xy}^{1.75} = 1$$

Equation 6-33

With:

$R_{bi} = RF_{bi}^{-1}$ ratio of biaxial compression flow $$R_{xy} = \frac{N^0_{xy_{comb}}}{N^c_{xy}}$$

ratio of shear flow where $N_{xy}^c$ is the buckling flow capacity calculated in pure shear load.

The method according to the invention also includes an iteration loop (see FIG. 7). This loop makes it possible to modify the value of applied loads, or the dimensional values of panels stiffened by triangular pockets in consideration, according to the results of at least one of steps 3 to 6.

The method, such as has been described, can be implemented at least partially in the form of a macro on a spreadsheet type programme.

Such a programme used thus, for example, for entering material and geometry data stored in a dedicated zone, as well as various cases of considered loads and boundary conditions, and supplying exit values for panel mass, reserve factor at ultimate load concerning in particular triangular pockets, stiffeners and general failure. These exit data thus highlight the cases of loads or dimensioning which are incompatible with the desired reserve factors.

Advantages of the Invention

We understand that the NASA process previously known, has been substantially extended in the frame of the present invention to take into account the particularities of the aeronautical domain:

Local capacity values for stiffeners (destruction, lateral instability etc.) for compression according to direction X or Y and shear load, Local capacity values of the triangular skin for compression according to direction X or Y and shear load, Plasticity correction, Preliminary mass calculation, Calculation of general buckling for a compression according to direction X or Y and a shear load.

The principal improvements are the calculation of stress capacities for the different types of buckling and the calculations of adapted reserve factors.

Extensions: Case of loading double-compression (for local and global buckling)

Combined loading: compression and shear load

Extensions: Improvements of the parameters of the method

No limitation on the material's Poisson coefficient

Variation of the grid angle (different by 60°)

Plasticity where the structure stiffened by the triangular pockets is considered as an equivalent stiffened panel Boundary conditions (clamping or intermediate boundary conditions) on the local or global buckling One of the most significant advantages of the method of dimensioning according to the invention is the possibility of installing panels stiffened by triangular pockets, instead of and in place of the panels previously created with two perpendicular families of stiffeners (longerons and ribs) underneath, resulting, for equal mechanical resistance, in a mass gain reaching 30% on some pieces.

Variations of the Invention

The scope of the present invention is not limited to details of the types of embodiment considered above as an example, but extends on the contrary to modifications to the scope of those skilled in the art.

In the present description we have referred to isosceles triangle base angles of between 45° and 70°, which correspond to current requirements for aeronautical structures. It is however clear that a similar method can be implemented for all isosceles angle values in panels stiffened by triangular pockets.

The invention claimed is:

1. A non-transitory computer-readable medium having computer-readable instructions thereon which when executed by a computer cause the computer to execute a method of dimensioning a composite or metallic panel consisting of a homogeneous and isotropic material, the panel having a skin reinforced by a triangular grid of stiffeners, the method comprising:

storing material data of the panel, a first set of geometric data of the panel, loads applied on the panel, and boundary conditions applied on the panel in a database;

defining a straight section for each stiffener of the triangular grid;

calculating a flow in the skin, stresses in the skin, stresses in the stiffeners based on the first set of geometric data of the panel, the loads applied on the panel, and the straight sections;

calculating a local buckling of the skin based on the first set of geometric data of the panel, the material data of the panel, the boundary conditions and the stresses in the skin, and stresses in the stiffeners, wherein calculating the local buckling includes:

implementing a finite element parametric model on the triangular grid based on the first set of geometric data of the panel and the boundary conditions, determining for each triangle of the triangular grid, a flow capacity of wrinkling based on the boundary conditions, interpolating the flow capacity as a quadratic function of a ratio between a panel stiffness and a square of a height the panel, obtaining a first coefficient and a second coefficient of the quadratic function;

calculating a local buckling of the stiffeners based on the first set of geometric data of the panel, the material data of the panel, the boundary conditions, the first coefficient, and the second coefficient;

calculating reserve factors based on the local buckling of the skin and the local buckling of the stiffeners;

performing structural analysis of the panel based on the calculated reserve factors; and implementing the performed structural analysis for dimensioning the panel.

2. The non-transitory computer-readable medium of claim 1, the method further comprising performing a resistance analysis on the panel based on the stresses in the skin, the stresses in the stiffeners, a maximum stress capacity of the skin included in the material data, and a maximum stress capacity of the stiffeners included in the material data.

3. The non-transitory computer-readable medium of claim 1, wherein the method further comprising calculating a general instability based on the first set of geometric data, the material data, the loads applied on the panel, and the boundary conditions, wherein the calculating of the general instability includes obtaining a buckling flow capacity for the skin and a combined buckling flow capacity for the skin and the stiffeners.

4. The non-transitory computer-readable medium of claim 1, wherein the method further comprising implementing a distribution of applied stresses between the panel and the stiffeners based on the effective straight sections, an effective thickness of the panel included in the first set of geometric data, a plasticity of the skin included in the material data and a plasticity of the stiffeners included in the material data.

5. The non-transitory computer-readable medium of claim 4, wherein the method further comprising correcting iteratively the plasticity of the skin and the plasticity of the stiffeners based on the distribution of applied stresses.

6. The non-transitory computer-readable medium of claim 5, wherein the method further comprising correcting the applied loads to take into account the plasticity of the skin and the plasticity of the stiffeners.

7. The non-transitory computer-readable medium of claim 6, wherein correcting the applied loads further comprising calculating iteratively the stress of the skin and the stress stiffeners until elasto-plastic Poisson coefficients and Young's modulus of the skin and elasto-plastic Poisson coefficients and Young's modulus of the stiffeners have converged.

8. The non-transitory computer-readable medium of claim 1, wherein the boundary conditions are at least one of clamped, free, and supported.

9. The non-transitory computer-readable medium of claim 1, further includes calculating a mass of the panel based on the first set of geometric data and the material data.

10. The non-transitory computer-readable medium of claim 1, wherein each triangle of the triangular grid of stiffeners is isosceles and has a base angle varying between 45° and 70°.

11. The non-transitory computer-readable medium of claim 1, wherein the loads applied are configured to generate a first compression load rate $R_{cX}$ in a first direction of the panel, a second compression load rate $R_{cY}$ in a second direction of the panel perpendicular to the first direction, and a shear load rate $R_s$, wherein the first compression load rate $R_{cX}$, the second compression load rate $R_{cY}$, and the shear load rate $R_s$ follow a polynomial relationship $R_{cX}+R_{cY}+R_s^{3/2}=1$.

12. The non-transitory computer-readable medium of claim 1, wherein the panel is an aircraft panel.

* * * * *